United States Patent
Smith et al.

(10) Patent No.: US 10,604,660 B2
(45) Date of Patent: Mar. 31, 2020

(54) WEAR RESISTANT COATING, ARTICLE, AND METHOD

(75) Inventors: David A. Smith, Bellefonte, PA (US); James B. Mattzela, State College, PA (US); Paul H. Silvis, Port Matilda, PA (US); Gary A. Barone, Bellefonte, PA (US); Martin E. Higgins, Bellefonte, PA (US)

(73) Assignee: SILCOTEK CORP., Bellefonte, PA (US)

( * ) Notice: Subject to any disclaimer, the term of this patent is extended or adjusted under 35 U.S.C. 154(b) by 1890 days.

(21) Appl. No.: 13/876,328

(22) PCT Filed: Oct. 5, 2011

(86) PCT No.: PCT/US2011/054835
§ 371 (c)(1),
(2), (4) Date: May 23, 2013

(87) PCT Pub. No.: WO2012/047945
PCT Pub. Date: Apr. 12, 2012

(65) Prior Publication Data
US 2013/0244025 A1    Sep. 19, 2013

Related U.S. Application Data

(60) Provisional application No. 61/389,777, filed on Oct. 5, 2010, provisional application No. 61/507,650, filed on Jul. 14, 2011.

(51) Int. Cl.
*C09D 5/00* (2006.01)
*C23C 16/30* (2006.01)
(Continued)

(52) U.S. Cl.
CPC ............ *C09D 5/00* (2013.01); *C23C 16/0272* (2013.01); *C23C 16/18* (2013.01); *C23C 16/30* (2013.01);
(Continued)

(58) Field of Classification Search
None
See application file for complete search history.

(56) References Cited

U.S. PATENT DOCUMENTS 4,173,661 A   11/1979  Bourdon
4,579,752 A    4/1986  Dubois et al.
(Continued)

FOREIGN PATENT DOCUMENTS

EP    1988190 A2     5/2008
WO    2009143618 A1  12/2009

OTHER PUBLICATIONS

H.E. O'Neal and M.A. Ring, "Mechanism of the Thermal Decomposition of Dimethylsilane at Atmostpheric Pressures in the Gas Phase", Organometallics, American Chemical Society, vol. 7, No. 5, May 1988, pp. 1017-1025.
(Continued)

*Primary Examiner* — Scott R. Walshon
*Assistant Examiner* — Elaine M Vazquez
(74) *Attorney, Agent, or Firm* — McNees Wallace & Nurick LLC

(57) ABSTRACT

A wear coating is disclosed that includes a layer treated by a trifunctional organosilane. An article is also disclosed, the article having a surface to which the wear coating is applied. A method of applying the wear coating is also disclosed. In some embodiments, the organosilane is trimethylsilane and the wear coating is applied by chemical vapor deposition, followed by heat treating the wear coating in the presence of the trimethylsilane.

19 Claims, 18 Drawing Sheets

(51) Int. Cl.
    C23C 16/56    (2006.01)
    C23C 16/40    (2006.01)
    C23C 30/00    (2006.01)
    C23C 16/02    (2006.01)
    C23C 16/18    (2006.01)
(52) U.S. Cl.
    CPC ............ C23C 16/401 (2013.01); C23C 16/56
                (2013.01); C23C 30/00 (2013.01); Y10T
                428/265 (2015.01); Y10T 428/31612
                (2015.04); Y10T 428/31663 (2015.04)

(56)                References Cited

U.S. PATENT DOCUMENTS

| | | | |
|---|---|---|---|
| 4,671,997 | A | 6/1987 | Galasso et al. |
| 4,714,632 | A | 12/1987 | Cabrera et al. |
| 4,741,964 | A | 5/1988 | Haller |
| 4,749,631 | A | 6/1988 | Haluska et al. |
| 4,753,856 | A | 6/1988 | Haluska et al. |
| 4,792,460 | A | 12/1988 | Chu et al. |
| 4,842,888 | A | 6/1989 | Haluska et al. |
| 5,160,544 | A | 11/1992 | Garg et al. |
| 5,249,554 | A | 10/1993 | Tamor et al. |
| 5,250,451 | A | 10/1993 | Chouan |
| 5,270,082 | A | 12/1993 | Lin et al. |
| 5,299,731 | A | 4/1994 | Liyanage et al. |
| 5,480,677 | A | 1/1996 | Li et al. |
| 5,481,135 | A | 1/1996 | Chandra et al. |
| 5,562,952 | A | 10/1996 | Nakahigashi et al. |
| 5,563,102 | A | 10/1996 | Michael |
| 5,818,071 | A | 10/1998 | Loboda et al. |
| 5,825,078 | A | 10/1998 | Michael |
| 6,159,871 | A | 12/2000 | Loboda et al. |
| 6,444,326 | B1 | 9/2002 | Smith |
| 6,472,076 | B1 | 10/2002 | Hacker |
| 6,511,760 | B1 | 1/2003 | Barone et al. |
| 6,531,398 | B1 | 3/2003 | Gaillard et al. |
| 6,593,655 | B1 | 7/2003 | Loboda et al. |
| 7,070,833 | B2 | 7/2006 | Smith et al. |
| 7,867,627 | B2 | 1/2011 | Smith et al. |
| 2003/0186000 | A1 | 10/2003 | Li et al. |
| 2004/0175579 | A1 | 9/2004 | Smith et al. |
| 2006/0216952 | A1 | 9/2006 | Bhanap et al. |
| 2007/0284255 | A1* | 12/2007 | Gorokhovsky ......... C22C 38/44 205/89 |
| 2009/0230558 | A1 | 9/2009 | Matsuoka |
| 2012/0251797 | A1 | 10/2012 | Smith et al. |
| 2013/0244025 | A1 | 9/2013 | Smith et al. |
| 2014/0370300 | A1 | 12/2014 | Smith |
| 2015/0030885 | A1 | 1/2015 | Smith |
| 2015/0283307 | A1 | 10/2015 | Smith et al. |

OTHER PUBLICATIONS

Restek Performance Coatings Service Through Technology, www.restekcorp.com, 2003, 1 pg.
D.A. Smith, D. Shelow and G. Barone, "Instrument and Sampling Equipment Passivation Requirements to Meet Current Demands for Low-Level Sulfur Analysis," 2001, 37 pgs.
Fast Facts At-a-Glance Product Information from Restek, Silcosteel-UHV, Dramatically Reduce Outgassing in UHV Systems, www.restekcorp.com, 2001, 2 pgs.
Fast Facts At-a-Glance Product Information from Restek, Silcosteel-CR, Achieve Specialty Alloy Performance Using Austenitic Stainless Steels, www.restekcorp.com, 2004, 4 pgs.
D.A. Smith, G.B. Stidsen, B. Burger and D. Shelow, "The Containment and Transfer of Trace Sulfur Gases at Low-PPBV Levels," 2001, 37 pgs.
G.A. Barone, D.A. Smith and M. Higgins, "Anti-Corrosive and Anti-Coking Properties of Unique Surface Coatings for Metal Substrates in Petrochemical Service," www.restekcorp.com, obtained Feb. 2015, 19 pgs.
G.A. Barone, D.A. Smith and D. Shelow, "Advantages to Using Inert, Coated Components for Sampling & Measurement of Organo-Sulfur Compounds," www.restekcorp.com, obtained Feb. 2015, 17 pgs.
R.L. Firor and B.D. Quimby, "Dual-Channel Gas Chromatographic System for the Determination of Low-Level Sulfur in Hydrocarbon Gases," Agilent Technologies, Inc., Mar. 2003, 10 pgs.
R.L. Firor, "Use of GC/MSD for Determination of Volatile Sulfur: Application in Natural Gas Fuel Cell Systems and Other Gaseous Streams," Agilent Technologies, Inc., Nov. 2001, 10 pgs.
V. Pretorius and J.D. Du Toit, "Gas Chromatography in Glass and Fused Silica Capillary Columns: Deactivation of the Inner Surface Using Silicon Films," Journal of HRC & CC, 1981, 2 pgs.
D.A. Smith, M. Higgins and G. Barone, "Evaluation of System Surfaces in Low-Level Sulfur Analysis for the Petrochemical Industry," www.restekcorp.com, obtained Feb. 2015, 37 pgs.
G. Barone, D.Smith and M. Higgins, "Selection of Surface Coatings for Process Lines and Equipment Used in Corrosive and Reactive Streams", Analytical Solutions for Energy Optimization & Environmental Compliance, The 54th Annual Symposium of the Analysis Division, Apr. 2009, 17 pgs.
J. De Zeeuw, G. Barone and M. Higgins, "Comparing Surface Adsorption Effects During the Analysis of Mercury and Sulfur Containing Streams," www.restekcoatings.com, obtained Feb. 2015, 30 pgs.
G. Barone, D. Smith, M. Higgins and T. Neeme, "Study of Chemical and Physical Adsorption Properties of Moisture, Sulfur, and Mercury Streams Through a Variety of Tubing Substrates," ISA 53rd Analysis Division Symposium, 2008, 9 pgs.
D.A. Smith and J.B. Mattzela, The Deposition and Functionalization of Silicon-Based Materials to Prevent Surface Corrosion, Adsorption, Contamination and Catalytic Interactions, MS&T'09, Oct. 2009, 21 pgs.
W. Bertsch and V. Pretorius, "Deactivation of Metal Surfaces for Capillary Columns for GC by Deposition of Silicon," Journal of HRC&CC, 1982, 3 pgs.
G.G. Gerhab and A. Schuyler, "Highly Inert Sample Pathways," 1996, 16 pgs.
A. Schuyler, J.W. Stauffer, C.E. Loope and C.R. Vargo, "Highly Efficient and Inert Stainless Steel GC Columns: A Durable, Flexible Alternative to Fused Silica," Elsevier Science Publishers, 1992, 6 pgs.
G. Gerhab and A. Schuyler, "Efficient and Rapid GC Analysis With Rugged Metal Microbore Capillary Columns," www.restekcorp.com, obtained Feb. 2015, 18 pgs.
J. De Zeeuw, "Deactivation of Metal Surfaces: Applications in Gas Chromatography (GC) for the Past 15 Years," American Laboratory, Nov. 2012, 10 pgs.

* cited by examiner

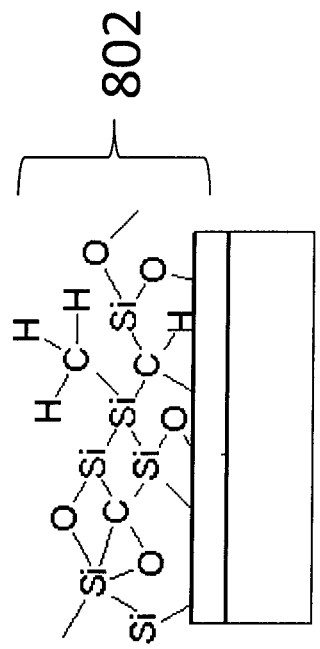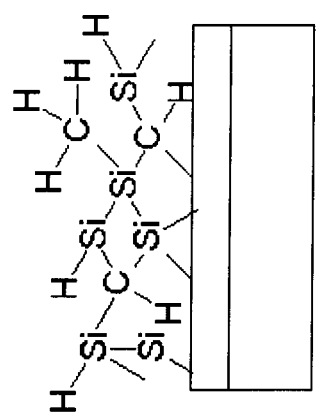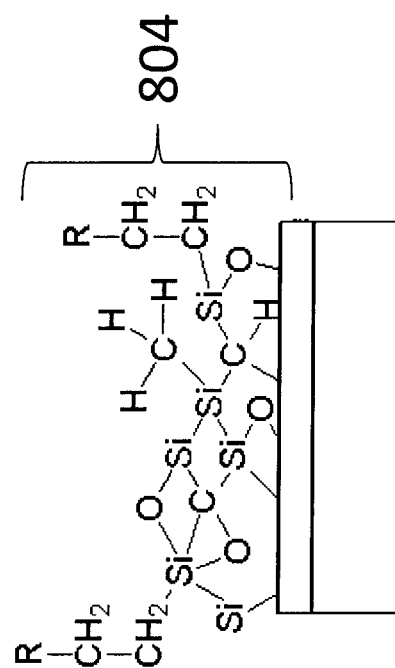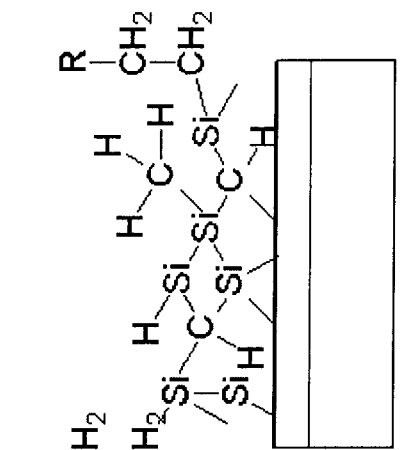
FIG - 8
FIG - 9

WEAR RESISTANT COATING, ARTICLE, AND METHOD

PRIORITY

This application claims priority to and the benefit of U.S. Appl. No. 61/389,777, filed Oct. 5, 2010 and U.S. Appl. No. 61/507,650 filed Jul. 14, 2011, both of which are hereby incorporated by reference in their entirety.

FIELD

The present disclosure is directed to a coating. More particularly, the disclosure is directed to a wear resistant coating applied to a substrate via decomposition of dimethylsilane.

BACKGROUND

Often, surfaces of substrates do not include desired performance characteristics. The failure to include specific desired performance characteristics can result in surface degradation in certain environments, an inability to meet certain performance requirements, or combinations thereof. For example, in certain environments, metallic, glass, and ceramic surfaces can be subjected to wear and other undesirable surface activities such as chemical adsorption, catalytic activity, corrosive attack, oxidation, byproduct accumulation or stiction, and/or other undesirable surface activities.

Undesirable surface activities can cause chemisorption of other molecules, reversible and irreversible physisorption of other molecules, catalytic reactivity with other molecules, attack from foreign species, a molecular breakdown of the surface, physical loss of substrate or combinations thereof.

To provide certain desired performance characteristics, a silicon hydride surface and unsaturated hydrocarbon reagents can be reacted in the presence of a metal catalyst. Such processes suffer from the drawbacks that complete removal of this catalyst from the treated system is often difficult and the presence of the catalyst can reintroduce undesirable surface activity. Amorphous silicon-based chemical vapor deposition materials are also susceptible to dissolution by caustic high pH media, thereby limiting their use in such environments.

A coating may be applied to a surface to protect it from undesirable surface activities. One known method of depositing a coating on a surface is chemical vapor deposition (also commonly referred to as CVD). Generally, chemical vapor deposition deposits a solid material from a vapor under controlled atmospheric and temperature conditions for a predetermined time to form a coating. Chemical vapor deposition can include a primary treatment followed by functionalization (a surface reaction) to add predetermined molecules.

However, despite the prior use of chemical vapor deposition generally, molecules including silicon, carbon, and hydrogen have previously been considered undesirable for use as chemical vapor deposition precursors or have been applied in conjunction with other chemical vapor deposition precursors in the presence of additional depositional energies such as plasma and microwave fields. Thus, properties associated with such molecules have previously been unrealized through thermal chemical vapor deposition technology.

Furthermore, many known coatings do not provide adequate wear resistance which can lead to surface wear, which affects the operational life of the component on which the coating is applied. As operational environments are normally complex, it is desirable that coatings be formulated to prevent both the chemical and physical degradation to the surface of the component. An example of a component working in an aggressive environment is a drilling tool used in the oil and gas industry. The tool experiences high loads, high speeds and friction and, as a consequence high temperatures. Another example is components that are exposed to reciprocating wear between two surfaces. These factors can lead to surface wear of the components.

Accordingly, it would be desirable to improve current wear coatings that can overcome some or all of these and other drawbacks associated with known systems.

SUMMARY

An exemplary embodiment of the present disclosure relates to a wear coating comprising a layer treated by trimethylsilane.

Another exemplary embodiment of the present disclosure relates to an article having a surface that comprises a layer treated by trimethylsilane.

Another exemplary embodiment of the present disclosure relates to a method of applying a wear coating to an article followed by treating with a trifunctional organosilane.

In some embodiments, the wear coating is deposited by a chemical vapor deposition method.

In some embodiments, the trifunctional organosilane is trimethylsilane.

In some embodiments, the wear coating is oxidized and/or functionalized in addition to being treated with trifunctional organosilane.

An advantage of an embodiment of the present invention is that previously unavailable molecules including silicon, carbon, and hydrogen can be applied to substrate surfaces.

Another advantage of an embodiment of the present invention is that treatment of a substrate with trimethylsilane or other trifunctional organosilane over which substrate a dimethylsilane coating has been applied by CVD may provide improvements over untreated oxidized and/or functionalized versions of such coatings in one or more of inertness, corrosion resistance, hydrophobicity, pH resistance, wear resistance and hardness.

Another advantage is that the treatment can be used such that the coating can be adjusted for anti-stiction and anti-coking properties.

Another advantage of an embodiment of the present invention is that wear coatings having improved wear resistance can be achieved.

Further aspects of embodiments of the invention are disclosed herein. The features as discussed above, as well as other features and advantages of the present application will be appreciated and understood by those skilled in the art from the following drawings and detailed description.

BRIEF DESCRIPTION OF THE DRAWINGS

FIG. 8 shows an exemplary water oxidation process in a chemical vapor deposition method according to an embodiment of the disclosure.

FIG. 9 shows an exemplary water oxidation process in a chemical vapor deposition and functionalization method according to an embodiment of the disclosure.

Wherever possible, the same reference numbers will be used throughout the drawings to represent the same parts.

DETAILED DESCRIPTION OF EXEMPLARY EMBODIMENTS

Provided is a coating, coated article, and a method of coating that do not suffer from drawbacks of the prior art. For example, embodiments of the coating, article, and method can utilize molecules including silicon, carbon, and hydrogen. In one embodiment, the method can be employed without an additional metal catalyst, devoid of additional residual catalyst activity, and combinations thereof. In one embodiment, the method increases hardness without substantially reducing inertness, chemical corrosive resistance, and/or other desirable properties. Exemplary coatings formed according to the disclosure can modify functionality, inertness, tailorability, hydrophobicity, anti-corrosive and/or anti-stiction behavior, hardness, wear resistance, or combinations thereof.

The coating is primarily intended to be carried out by chemical vapor deposition, typically but not necessarily by thermal application and not plasma assisted methods. It will further be appreciated that methods of application other than CVD that do not exceed 600° C. may also be employed.

According to a further embodiment, the coating may be treated by trimethylsilane. In one embodiment, the coating may be oxidized and thereafter treated by trimethylsilane. Treatment with the trimethylsilane may provide improvements over untreated oxidized and/or functionalized coatings in inertness, corrosion resistance, hydrophobicity, pH resistance, wear resistance and hardness, and combinations thereof Additionally or alternatively, the coating can be adjusted for anti-stiction and anti-coking properties.

Despite having a lower cost and higher availability than dimethylsilane, trimethylsilane has heretofore been believed to be undesirable for chemical vapor deposition. Generally, it has been believed that the use of trimethylsilane would result in undesirable properties including higher decomposition temperatures that may adversely affect the metallurgy of a target substrate and that it would involve prolonged deposition times, thereby affecting the throughput production capability.

Figure 1:
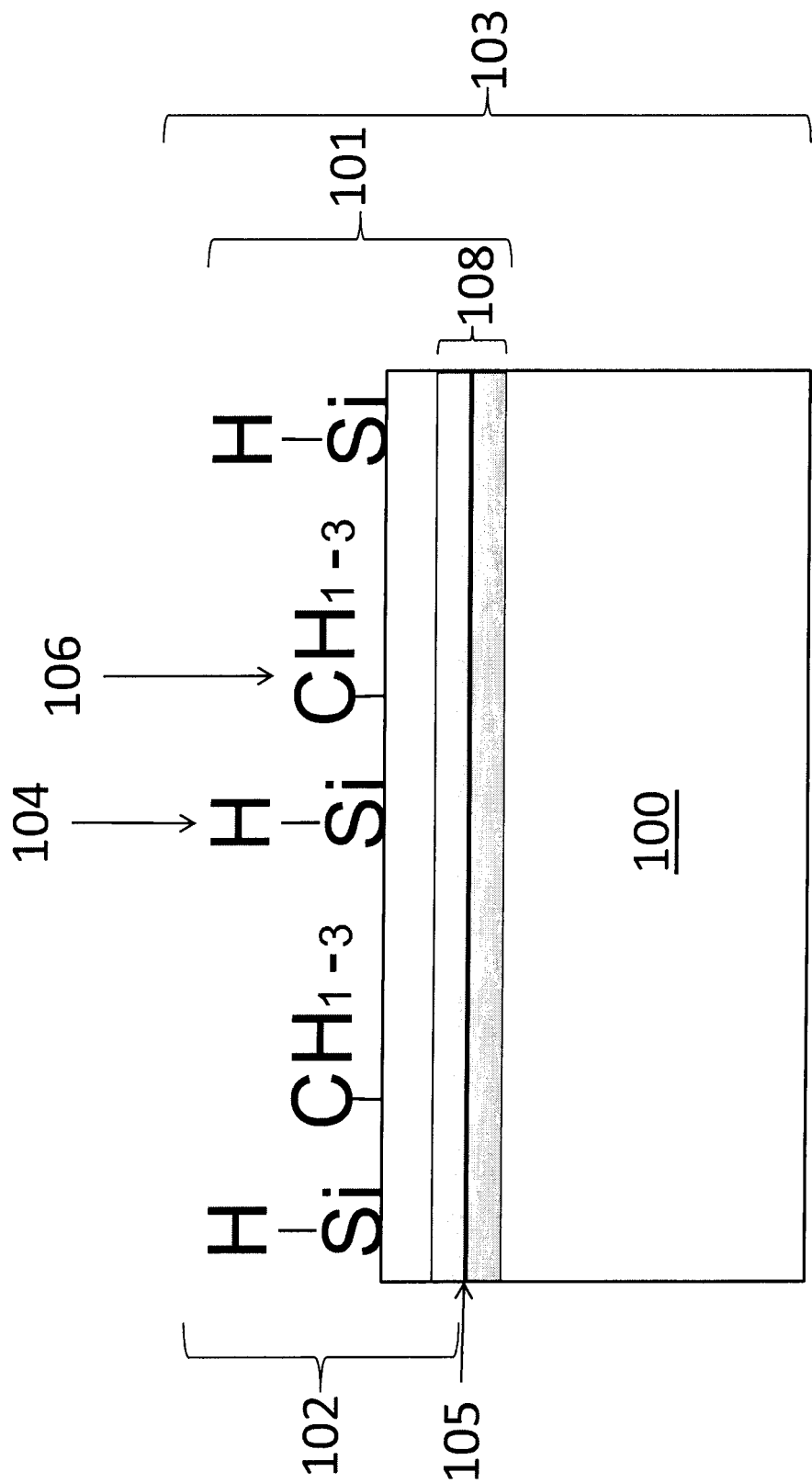
FIG. 1 shows an exemplary embodiment of a carbosilane coating on a substrate according to the disclosure.

Referring to FIG. 1, a substrate 100 according to an exemplary embodiment can include a surface 105 having improved surface properties achieved by controllably depositing a layer 102 that imparts a desired surface effect to the substrate 100, a coating 101, an article 103, or combinations thereof. The coating 101 is formed by chemical vapor deposition (for example, of dimethylsilane to form a carbosilane) followed by oxidation (for example, air-oxidation to form a carboxysilane) and/or functionalization (for example, with a hydrosilane to form a functionalized carboxysilane).

The imparting of the desired surface effect can improve performance of the surface 105 by diffusion of the layer 102 and/or the coating 101 into the surface 105 of the substrate 100. The layer 102 can be applied to any suitable substrate. For example, the substrate 100 can be a metallic substrate (ferrous or non-ferrous), a glass substrate, or a ceramic substrate.

In an exemplary embodiment, the layer 102 is formed by thermal decomposition of dimethylsilane. By thermally decomposing dimethylsilane, the layer 102 includes molecules including silicon, carbon, and hydrogen atoms that can be active sites. These molecules within the layer 102 can include a first portion 104 and a second portion 106. Generally, the first portion 104 and the second portion 106 are not spatially resolvable (for example, the first portion 104 and the second portion 106 are defined by the molecules deposited on the layer 102 and the molecules may be interspersed throughout the layer 102). Furthermore, use of the terms "first" and "second" is not intended to imply any sequentiality, difference in quantity, difference in size, or other distinction between the two portions. To the contrary, the terms "first" and "second" are used for distinguishing molecular composition of the two portions. For example, in one embodiment, the first portion 104 includes silicon and the second portion 106 includes carbon. In one embodiment, the first portion 104 and the second portion 106 are bound together randomly throughout the layer 102.

Figure 2:
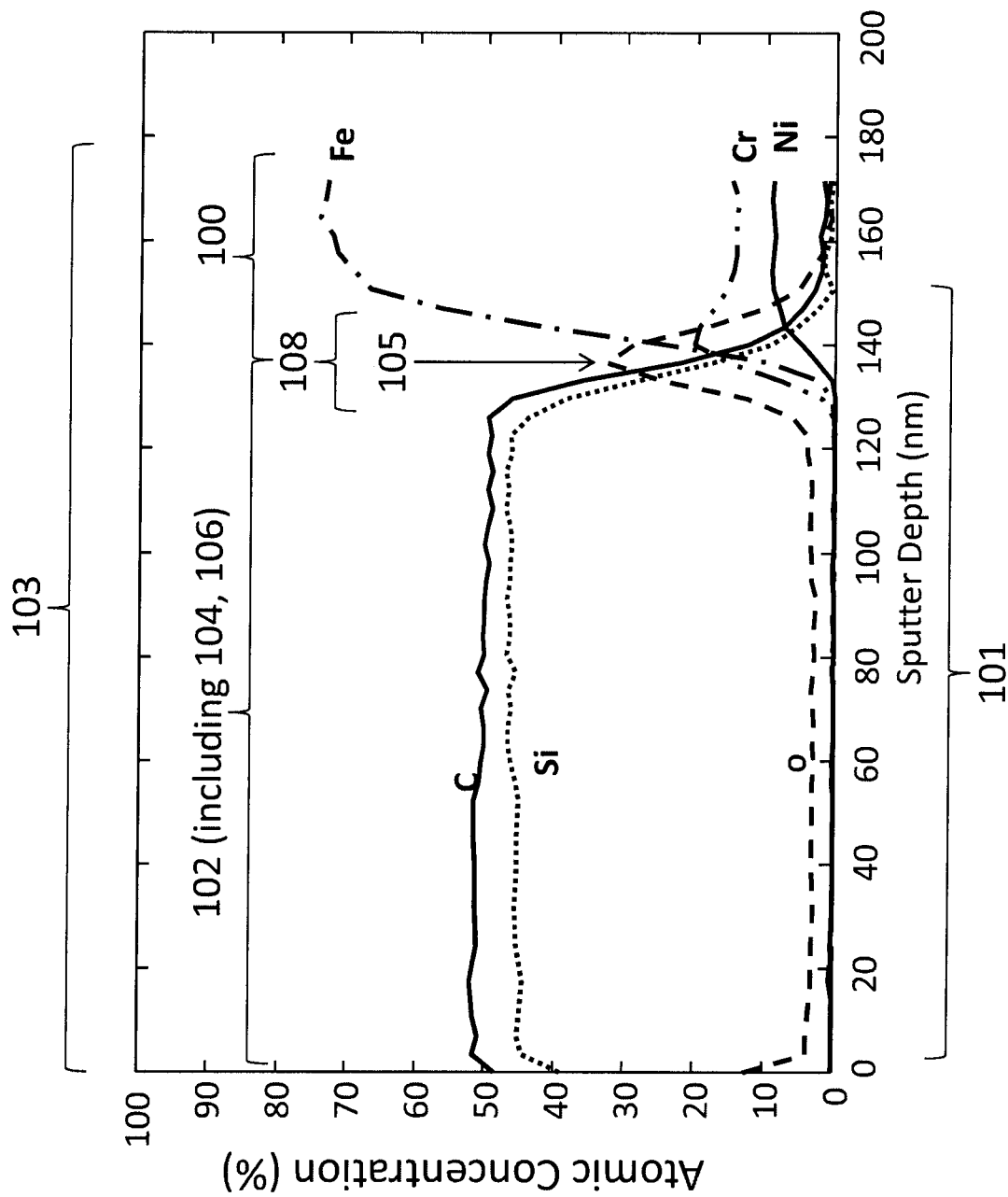
FIG. 2 shows an Auger Electron Spectroscopy plot for an exemplary embodiment of a carbosilane coating having a layer on a substrate according to the disclosure.

FIG. 2 illustrates diffusion of the layer 102 and/or the coating 101 into the substrate 100 according to an exemplary embodiment. Applying dimethylsilane to preselected surfaces has resulted in improved chemical resistance, improved inertness, and improved adhesion over non-diffusion coatings. FIG. 2 corresponds to the layer 102 having the first portion 104 with carbon and the second portion 106 having silicon. Specifically, FIG. 2 shows the composition of the layer 102 within the substrate 100 and/or the article 103 by Auger Electron Spectroscopy measurements of the layer 102.

In one embodiment, dimethylsilane is thermally decomposed and deposited as amorphous carbosilane for 15 hours. In this embodiment, the layer 102 extends to about 130 nanometers and includes a portion of the diffusion region 108 identifiable based upon an increased concentration of O and decreased concentration of C and Si (for example, by at least a factor of four). The range of the layer 102 can be between about 0.1 micrometers to about 3.0 micrometers. The diffusion region 108 can be between about 5 nanometers and 500 nanometers. In one embodiment, the diffusion region 108 is about 20 nanometers. It will be appreciated that precise measurement of the diffusion layer via Auger Electron Spectroscopy can be offset by surface roughness of the substrate and coating. Therefore, the diffusion region as measured by Auger Electron Spectroscopy is not an absolute measurement but a representation of the diffusion mechanism according to the process. The composition of layer 102 is about 1:0.95:0.12 ratio of C:Si:O. In contrast, the composition of dimethylsilane introduced into the chemical vapor deposition chamber has about a 2:1 ratio of C:Si. It is believed that $CH_x$ (x=0-3) moieties are retained and Si—C bonds are broken thus indicating that layer 102 includes an amorphous array of Si—C bonding. The amorphous array provides additional benefits such as decreased cracking or flaking, for example, upon tensile or compressive forces acting on the substrate 100, and/or increased adhesion. In one embodiment, multiple layers of the coating 101 or similar coatings are deposited for thicker layers or for desired properties.

Figure 3:
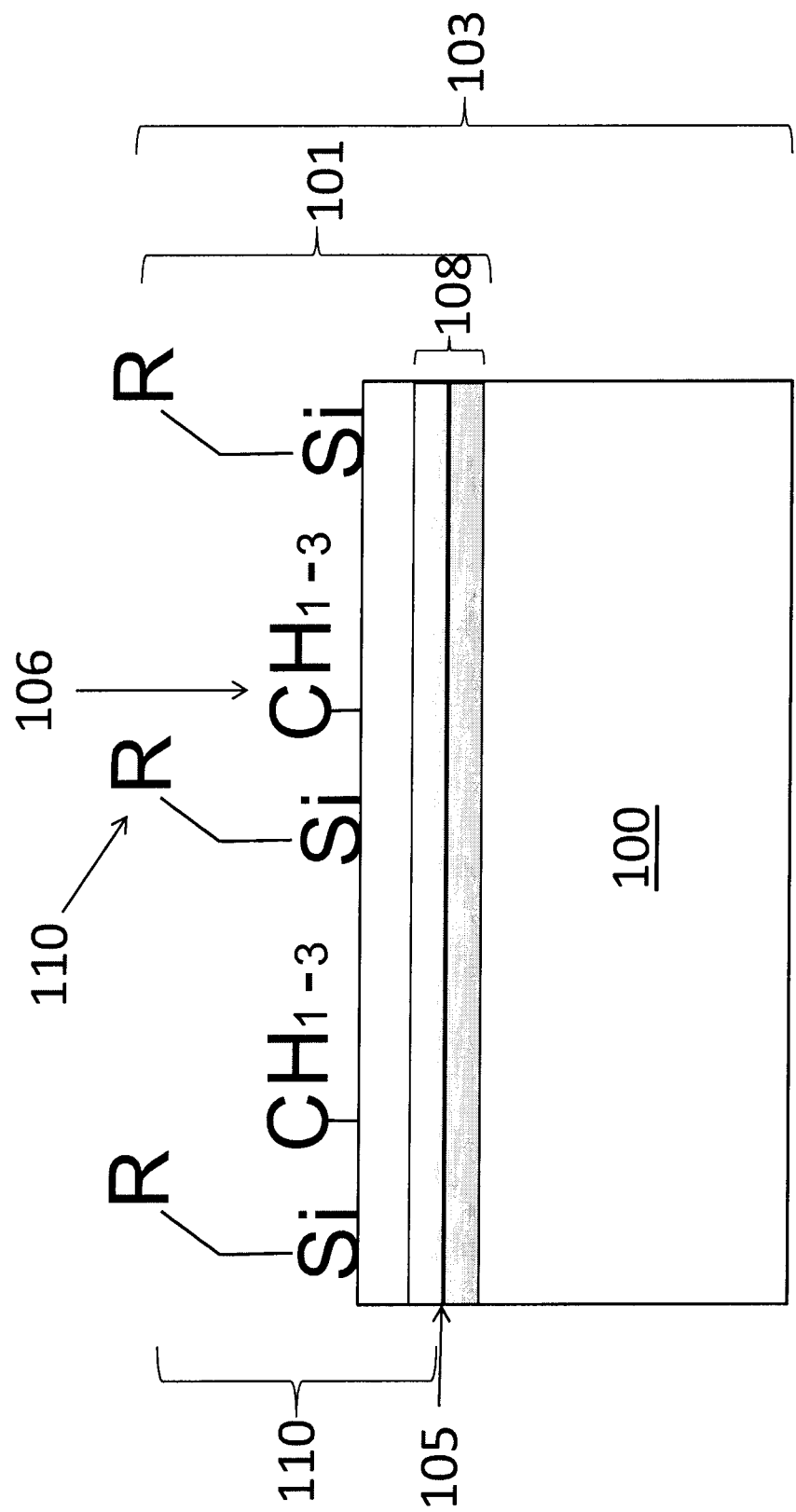
FIG. 3 shows an exemplary embodiment of a functionalized carbosilane coating on a substrate according to the disclosure.

FIG. 3 shows an exemplary embodiment having a functionalized layer 110. The functionalized layer 110 is formed by thermally reacting silicon hydride moieties with unsaturated hydrocarbons (for example, having the formula $H_2C$=CH—R and/or HC≡C—R) and includes R-groups bonded to all or part of first portion 104 of the layer 102. R-groups can be formed by any suitable organic reagent having one or more unsaturated hydrocarbon groups. R-groups can be formed by hydrocarbons, substituted hydrocarbons (for example, halogenated), carbonyls, carboxyls, esters, ethers, amines, amides, sulfonic acids, organometallic complexes, and/or epoxides.

Figure 4:
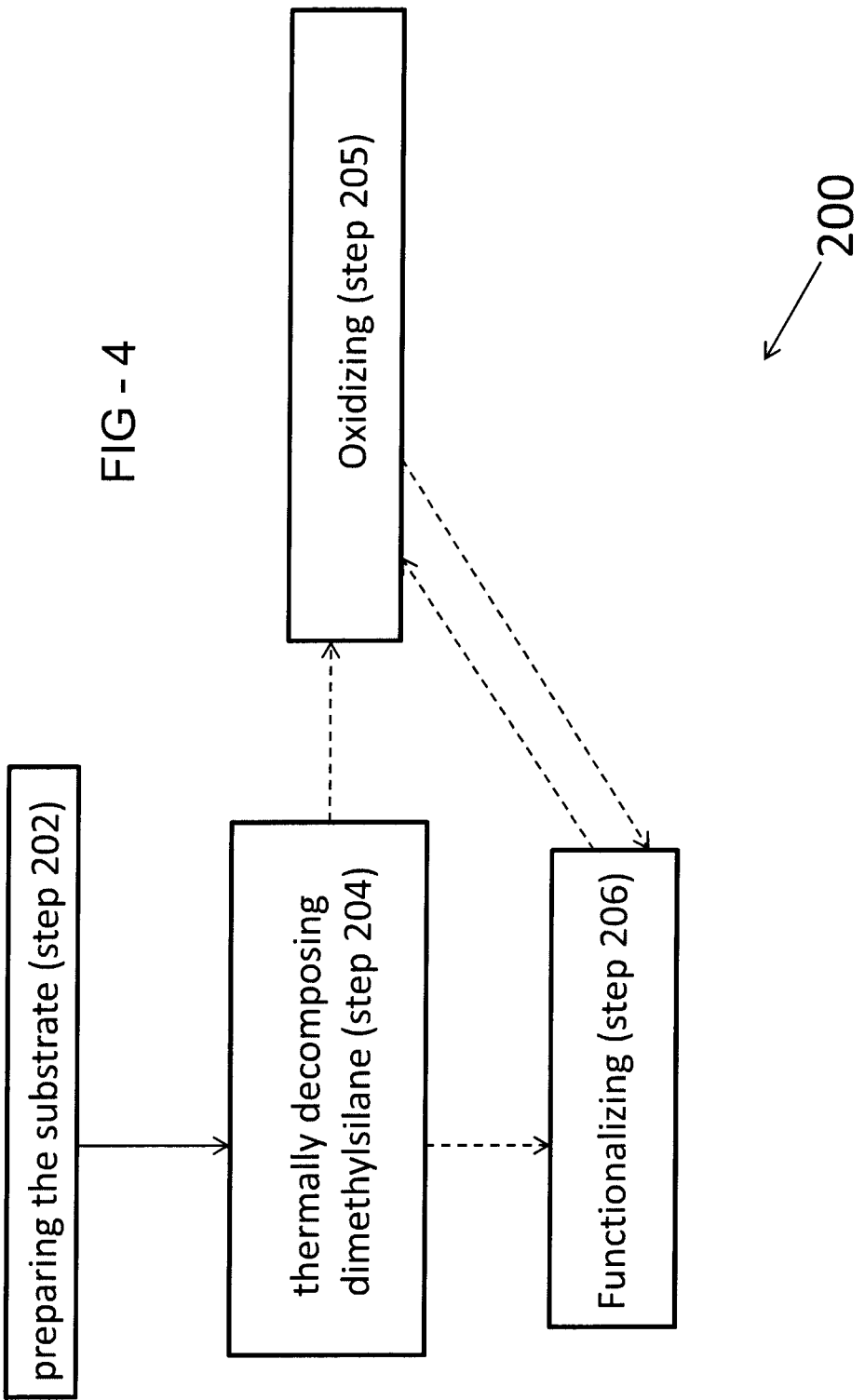
FIG. 4 shows a chemical vapor deposition method according to an exemplary embodiment of the disclosure.
Figure 5:
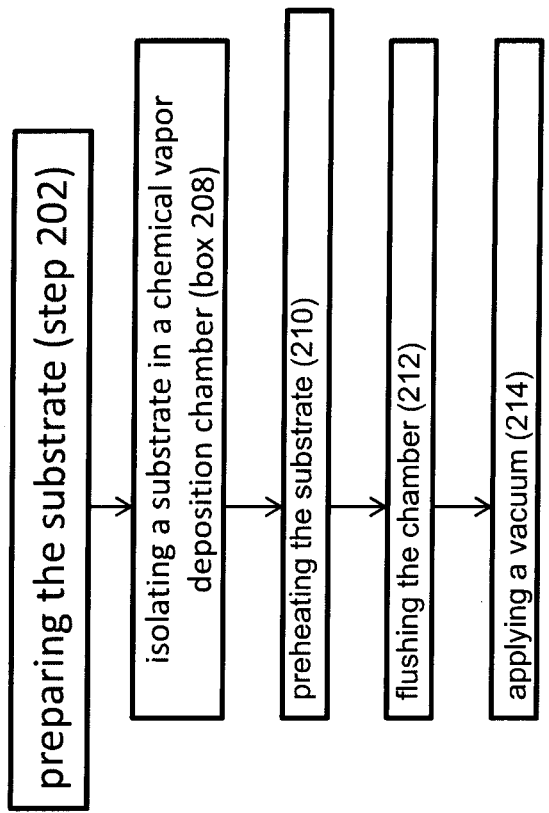
FIG. 5 shows an exemplary treatment method in a chemical vapor deposition method according to the disclosure.

FIG. 4 shows an exemplary chemical vapor deposition method 200 for forming the layer 102 that includes preparing the substrate (step 202) and thermally decomposing dimethylsilane (step 204). Preparing the substrate (step 202) can be performed by any suitable treatment method. For example, referring to FIG. 5, preparing the substrate (step 202) can include isolating a substrate in a chemical vapor deposition chamber (substep 208), preheating the substrate (substep 210), flushing the chamber (substep 212) with an inert gas, and evacuating the chamber (substep 214).

Isolating the substrate (substep 208) is performed in an inert atmosphere within the chamber. The flow of gas and/or maintenance of a vacuum in the chamber can provide the controlled atmosphere. A heat source can control the temperature in the chamber to desorb water and remove remaining contaminants from the substrate surface (substep 210). For example, the surface to be treated can be included within a chemical vapor deposition chamber with tubing connections to allow gas flow in and out of the chemical vapor deposition chamber. The chamber can include multiple controlled inlets and outlets configured for providing and removing multiple gas streams. A vacuum may be connected to one or more outlet tubes.

Depending upon the cleanliness of the substrate, the substrate may be prepared by heating (substep 210) at a temperature above about 100° C. at a pressure of below about 1 atmosphere for a period ranging from a few minutes to about 15 hours. Generally, the temperature of the heating corresponds to the properties of the substrate 100. In one embodiment, the period is from about 0.5 to about 15 hours.

In another embodiment, the substrate is heated at about 450° C. for about 2 hours. After preparation under vacuum, the chamber may be selectively flushed (substep 212) with an inert gas and evacuated (substep 214).

Method 200 includes thermally decomposing the dimethylsilane (step 204). In general, dimethylsilane is not readily obtainable due to the low demand for it. Dimethylsilane has been regarded as undesirable in some chemical vapor deposition applications because it includes carbon and is much more expensive than silane. Silane and the monomethyl analogue to dimethylsilane, methylsilane, are both pyrophoric and may explode in air. Dimethylsilane, although flammable, is not pyrophoric. Thus, use of dimethylsilane can decrease safety risks. In addition, use of dimethylsilane can result in inertness of a coating and/or chemical resistance, thereby protecting a surface of a substrate.

Figure 6:
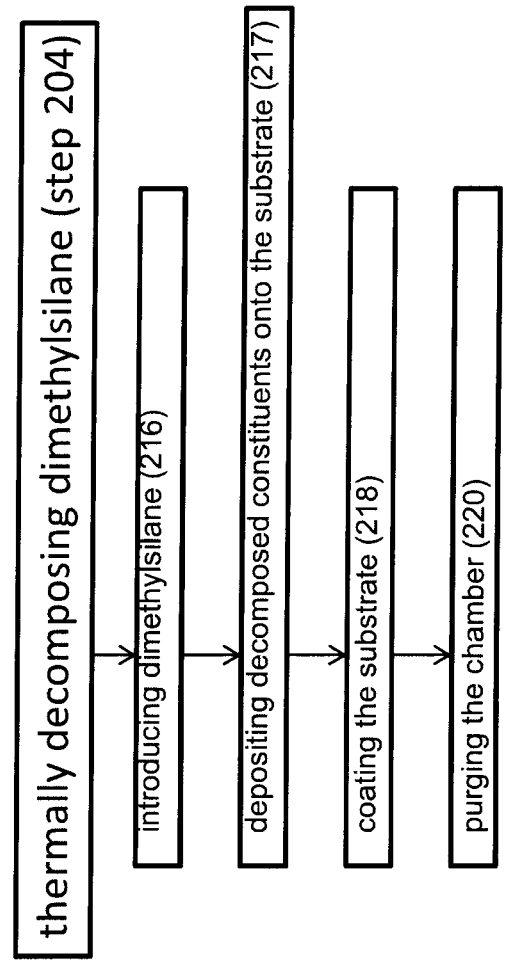
FIG. 6 shows an exemplary thermal decomposition in a chemical vapor deposition method according to the disclosure.

Referring to FIG. 6, thermal decomposition of dimethylsilane (step 204) includes introducing dimethylsilane (substep 216) into the chamber at a predetermined pressure and temperature sufficient to decompose dimethylsilane, depositing constituents from decomposition onto the substrate 100 (substep 217), coating the substrate (substep 218) for a predetermined period of time to achieve a predetermined thickness, and/or purging the chamber of dimethylsilane (substep 220). As is described in U.S. Pat. No. 6,444,326, which is incorporated herein by reference in its entirety, exemplary process conditions may include pressure being between about 0.01 psia to about 200 psia. The temperature can be between about 200° and 600° C. The time period can be from about 10 minutes to about 24 hours.

In one embodiment, the dimethylsilane introduced (substep 216) includes dimethylsilane in gaseous form. In one embodiment, the substrate is exposed to dimethylsilane gas at a pressure between about 1.0 psia and about 100 psia and a temperature between about 300° and 600° C. for a time of about 30 minutes to about 24 hours. In an exemplary embodiment, the substrate 100 is exposed to dimethylsilane gas at a temperature between about 400° and about 500° C. for about 15 hours. The pressure of the dimethylsilane gas may be between about 5 psia and about 40 psia.

The dimethylsilane is then thermally dissociated into molecular fragments including H, C, Si, and combinations thereof, and the constituents are deposited onto the substrate 100 (substep 217), thereby forming the coating 100 (substep 218) with a material including silicon, carbon, and hydrogen resulting from decomposition of dimethylsilane. Dimethylsilane gas may be introduced into the reaction chamber under reduced pressure or with an inert gas, such as nitrogen, helium, and/or argon, as a partial pressure dilutant. Although not intending to be bound by theory, it is believed that the dimethylsilane thermally decomposes to form carbosilyl fragments, which recombine and bind to the substrate surface. It is believed that the resultant coating includes amorphous carbosilanes having carbon, silicon, and hydrogen on the substrate surface as well as on exposed surfaces of the chamber. The deposited material also diffuses into the surface 105 of the substrate 100 as is illustrated in the Auger Electron Spectroscopy depth profile (FIG. 2, the diffusion region 108) thus supporting the mode of adhesion to the substrate 100. The chamber may then be purged of dimethylsilane and volatile, non-deposited carbosilyl fragments (substep 220). If a thicker deposition layer is desired, deposition conditions are changed. This is accomplished by changing temperature, pressure, time, or combinations thereof. Multiple layers can also be applied by repeating step 204.

Upon the layer 102 (as further described with reference in FIGS. 1 and 2) being formed, additional steps may be performed. In one embodiment, the layer 102 is functionalized next (step 206) as further described below with reference to FIG. 7 to form the functionalized layer 110. In one embodiment, the layer 102 (for example, amorphous carbosilane) is oxidized (step 205) as further described below with reference to FIG. 8 to form an initially-oxidized layer 802 (for example, amorphous carboxysilane). In one embodiment, the functionalized layer 110 (for example, functionalized amorphous carbosilane) is oxidized with water to form a functionalized-then-oxidized layer 804 (for example, functionalized amorphous carboxysilane) as further described below with reference to FIG. 9. In one embodiment, the oxidized layer 802 is functionalized to form an oxidized-then-functionalized layer (not shown). As used herein, the term "oxidized layer" generally refers to one or more of the initially-oxidized layer 802, the functionalized-then-oxidized layer 804, and the oxidized-then-functionalized layer (not shown).

Figure 7:
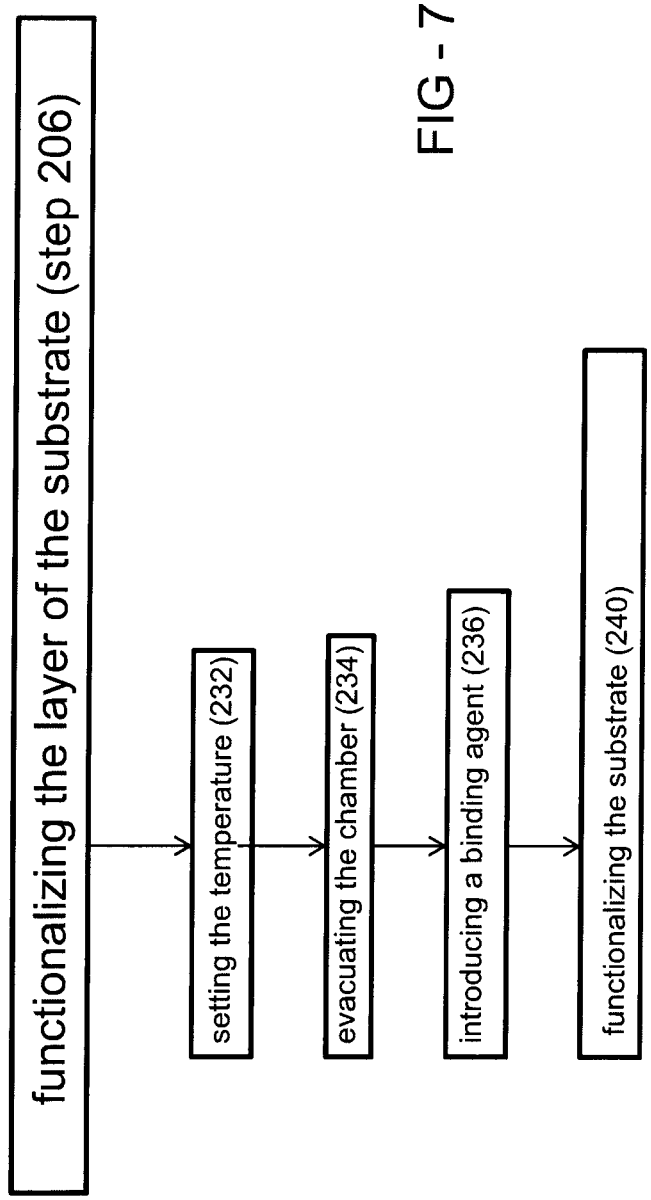
FIG. 7 shows an exemplary functionalization step in a chemical vapor deposition method according to the disclosure.

In one embodiment, the method 200 further includes functionalizing the layer 102 of the substrate 100 (step 206) to form the functionalized layer 110, as briefly discussed above with reference to FIG. 3. Referring to FIG. 7, functionalizing the layer 102 of the substrate 100 (step 206) may be performed by reacting with silicon hydride moieties remaining from the original carbosilane deposition (step 204). Following the carbosilane deposition on the substrate (step 204), the system is purged with an inert gas (which can be purging of substep 220 or a separate purge step) while the reaction chamber can be set to a predetermined functionalization temperature (substep 232). The purge removes gaseous carbosilane moieties and/or unreacted dimethylsilane moieties not bound to the substrate surface. After the purge and setting of the temperature (substep 232), the chamber is evacuated (substep 234).

Next, a binding agent is introduced into the chamber at a predetermined temperature and pressure within the chamber (substep 236). In one embodiment, with heat as a driving force, the binding reagent reacts with and binds to the carbosilyl surface via silicon hydride moieties. Binding agent examples are ethylene, propylene, and substituted unsaturated organic molecules. Residual moieties of the silicon hydride may be reacted under heat (for example, at about 400° C.) with $H_2C=C-R$ and/or $HC\equiv C-R$. R-groups can be formed by hydrocarbons, substituted hydrocarbons (for example, halogenated), carbonyls, carboxyls, esters, ethers, amines, amides, sulfonic acids, organometalic complexes, and/or epoxides.

In one embodiment, binding agent molecules are then bound to the substrate (substep 240). The coating can include a carbon-silicon covalent bond with an R-group. The R-group can be modified to adjust the properties of the surface. For example, the R-group can be modified to adjust the hydrophobicity of the surface. To adjust the hydrophobicity of the surface, the R-group can be a fluorinated hydrocarbon. The fluorinated hydrocarbon can form a hydrophobic and/or oleophobic surface. Additionally or alternatively, the R-group can include an organometallic substituent providing catalytic or biocidal properties. Although not intending to be bound by theory, it is believed that the moieties of silicon hydride can thermally react, via a hydrosilyation mechanism, with unsaturated hydrocarbon groups to covalently bond to the surface of the coated substrate. The resultant coating on all exposed surface within the reaction chamber includes covalently-bound R-groups which includes the R-group and carbon, silicon, and hydrogen moieties.

In one embodiment, method 200 further includes oxidizing the layer 102 of the substrate 100 (step 205) as briefly described above. Layer 102 is oxidized to form the oxidized layer (see above) by exposure to any suitable chemical species capable of donating a reactive oxygen species into the layer 102 under predetermined oxidation conditions. For example, the chemical species may be water, oxygen, air, nitrous oxide, ozone, peroxide, and combinations thereof. In general, oxidation is a bulk reaction that affects the bulk of the coating 101. The oxidation may be controlled by increasing or decreasing the temperature within the chamber, the exposure time within the chamber, the type and/or amount of diluent gases, pressure, and/or other suitable process conditions. Control of the oxidation can increase or decrease the amount and/or depth of oxidation and, thus, the wear resistance and/or hardness of the surface. In one embodiment, the layer 102 is exposed to water (for example, in an inert gas at a pressure of about 100 to 200 psia for about 450° C. for about two hours). In one embodiment, the functionalized layer 110 is exposed to water (for example, in an inert gas at a pressure of about 100 to 200 psia for about 450° C. for about two hours).

The oxidation improves hardness and/or wear resistance of carbosilane and functionalized carbosilane-based chemical vapor deposition process materials on ferrous metallic surfaces, non-ferrous metallic surfaces, and/or glass surfaces by controlled oxidation. In one embodiment, referring to FIG. 8, the layer 102 is an amorphous layer of carbosilane that is oxidized to form an amorphous layer of carboxysilane as the initially-oxidized layer 802. In one embodiment, referring to FIG. 9, the functionalized layer 110 is an amorphous layer of functionalized carbosilane that is oxidized to form an amorphous surface of functionalized carboxysilane as the functionalized-then-oxidized layer 804.

In one embodiment, the oxidizing (step 205) is performed with nitrous oxide ($N_2O$). Specifically, $N_2O$ is applied under heat (for example, about 450° C.) with a pressure of pure $N_2O$ in a vessel with carbosilane-coated samples. In this embodiment, the oxidizing (step 205) over-oxidizes and the over-oxidizing results in having a contact angle of about 60°, increases an amount of N—H, Si—OH, and/or C—OH groups, results in having relatively fragile scratch resistance, and increases acid resistance/corrosion resistance.

In one embodiment, the oxidizing (step 205) is performed with ozone. In this embodiment, the oxidizing (step 205) decreases wear resistance, decreases chemical resistance, decreases scratch resistance, decreases hardness, and increases acid resistance/corrosion resistance.

Figure 10:
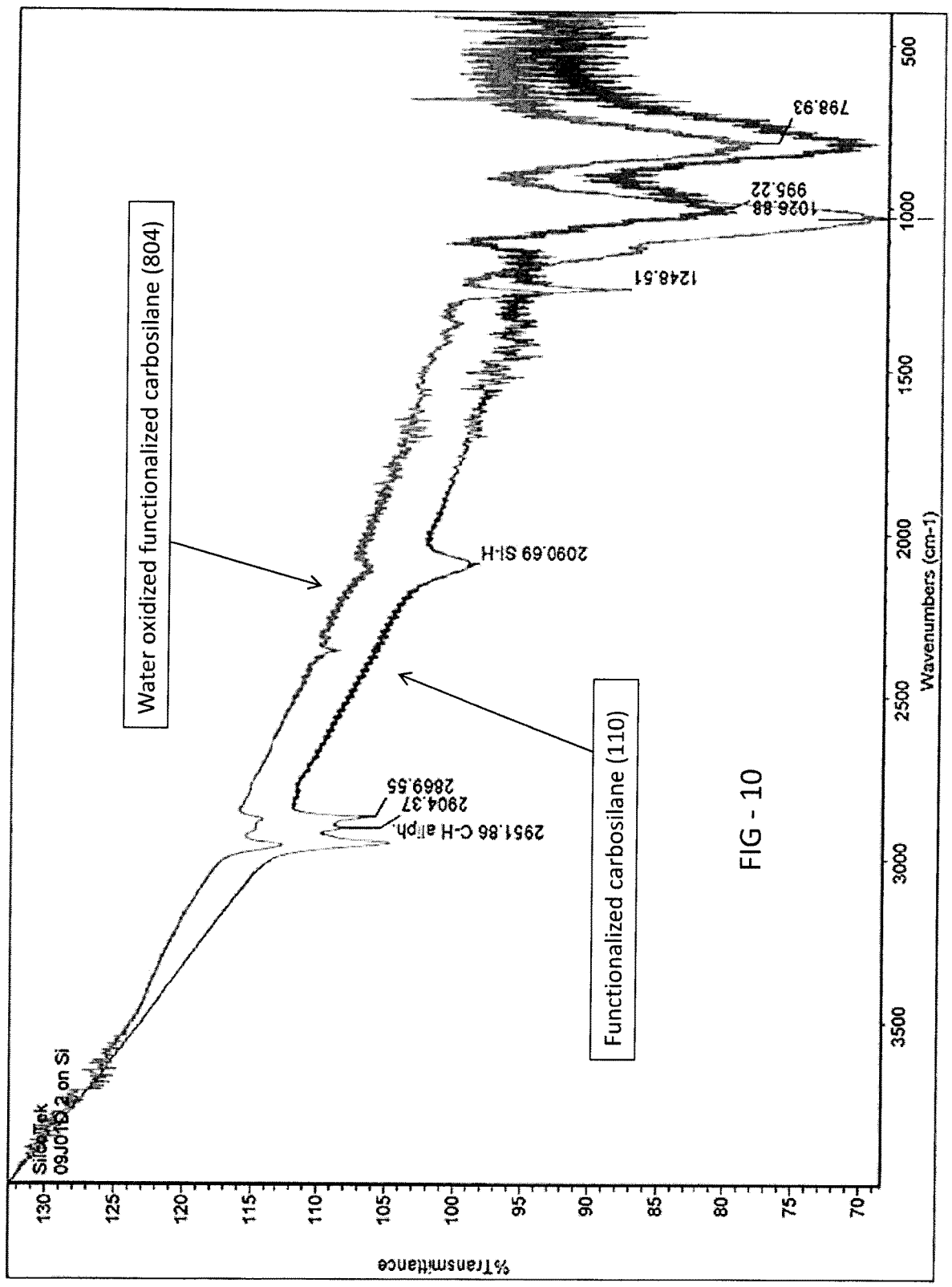
FIG. 10 shows a FT-IR plot for a dimethylsilane deposited, functionalized surface and a dimethylsilane deposited, functionalized and water oxidized surface.

In one embodiment, the oxidizing (step 205) is performed with water (only) as an oxidizing reagent (for example, at a temperature of about 450° C.). In this embodiment, the oxidizing (step 205) results in having a contact angle on a Si wafer of about 86.6°, lowers friction (in comparison to using an oxidizing reagent of air and water), decreases wear resistance (for example, in comparison to using an oxidizing reagent of air and water), and forms Si—O—Si groups (as illustrated in FIG. 10 by a growth of the Si—O—Si peak at 1026.9 $cm^{-1}$ compared to the non-water functionalized peak at 995.2 $cm^{-1}$).

In another embodiment, the oxidizing (step 205) is performed with an oxidizing reagent including air and water (for example, at a temperature of about 450° C.). In this embodiment, oxidizing (step 205) over-oxidizes and decreases an amount of C—H groups (for example, in comparison to using water alone as an oxidizing reagent), decreases an amount of Si—C groups (for example, in comparison to using water alone as an oxidizing reagent), and increases an amount of Si—OH/C—OH groups (for example, in comparison to using water alone as an oxidizing reagent).

In another embodiment, the oxidizing (step 205) is performed with air (only) (for example, at a temperature of about 450° C.). In this embodiment, oxidizing (step 205) lowers friction (for example, in comparison to using an oxidizing reagent of air and water), increases wear resistance (for example, in comparison to using an oxidizing reagent of air and water), and forms Si—O—Si groups.

In one embodiment, the layer 102 has a predetermined contact angle (for example, about 98.3° advancing) and the functionalized layer 110 has a higher contact angle (for example, about 100° advancing). In one embodiment, the layer 102 has a predetermined contact angle (for example, about 95.6° advancing) and a functionalized then oxidized layer 804 has a lower contact angle (for example, about 65.9° receding). In this embodiment, the oxidizing (step 205) forms Si—O—Si groups and decreases an amount of Si—H groups (for example, in comparison to the functionalized layer 110).

In one embodiment, the oxidized layer has a lower coefficient of friction (for example, about 0.84) than the non-oxidized layer 102 (for example, about 0.97). Similarly, in one embodiment, the oxidized layer has a lower wear rate (for example, about $6.75 \times 10^{-5}$ mm$^3$/N/m) than the non-oxidized layer 102 (for example, $4.73 \times 10^{-4}$ mm$^3$/N/m).

Figure 11:
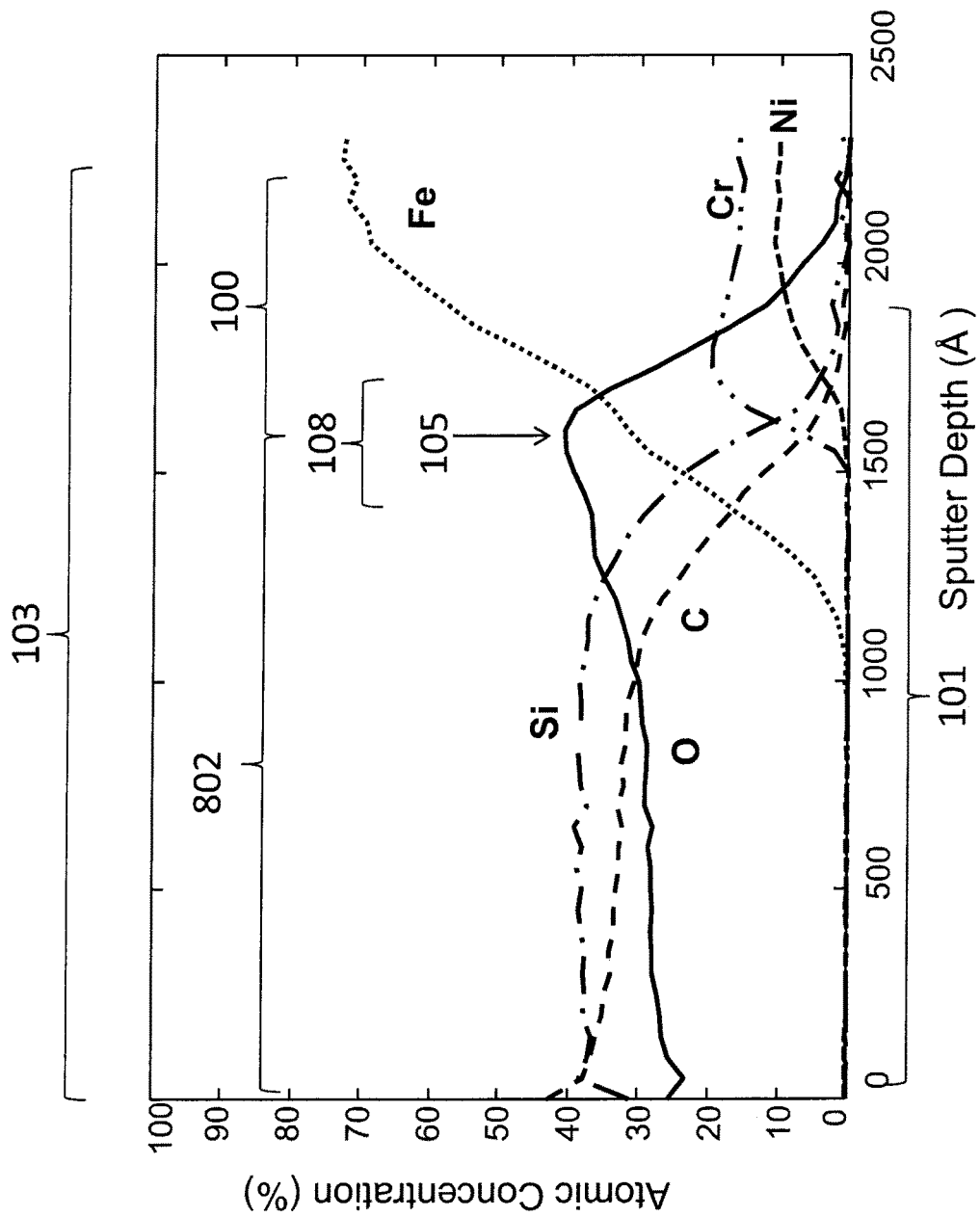
FIG. 11 shows an Auger Electron Spectroscopy plot for an exemplary embodiment of a coating having a water oxidized layer on a substrate according to the disclosure.

FIG. 11 illustrates diffusion of the oxidized layer into the substrate 100 (for example, stainless steel) according to an exemplary embodiment using water for oxidation. Specifically, FIG. 11 shows the composition of the oxidized layer within the substrate 100, the coating 101, and the article 103 by Auger Electron Spectroscopy. As shown, the oxidation is illustrated by Si—H moieties undergoing oxidation and elimination to create Si—O—Si linkages, as well as some Si—C and/or free carbon species being eliminated. In one embodiment, the oxidized layer extends to about 1600 Angstroms and includes the diffusion region 108 being about 250 Angstroms, identifiable based upon a decreased concentration of C and Si. The range of the oxidized layer can be between about 0.1 micrometers and about 3.0 micrometers. The diffusion region 108 can be between about 5 nanometers and 500 nanometers. The composition of the oxidized layer is about 1.0:1.22:0.91 (C:Si:O) with an increase in oxygen due to the preexisting oxide layer on substrate 100.

The layer 102 can also be oxidized in the presence of a different oxidation reagent. In one embodiment, the oxidation reagent is zero air. As used herein, the term "zero air" refers to atmospheric air having less than about 0.1 ppm total hydrocarbons. In one embodiment, the oxidation reagent consists of gaseous reagents. Due to the gaseous processing agents (for example, dimethylsilane and/or nitrogen) being in the gas phase, use of a gaseous oxidation reagent results in simpler scale-up for manufacturing, a more transferable process, and a more economical process.

Thus, used consistent with embodiments of the disclosure, dimethylsilane has several benefits for chemical vapor deposition. Additionally, a dimethylsilane-deposited material via thermal chemical vapor deposition has Si—H moieties available for surface functionalization with unsaturated hydrocarbons of formula $H_2C\!=\!CH\!-\!R$ or $HC\!\equiv\!C\!-\!R$. However, it is also known that oxidation of the carbosilane material to a carboxysilane material provides a dramatic improvement in material hardness and wear-resistance, yet sacrifices desirable qualities such as inertness and anti-corrosive performance.

Furthermore, although the oxidizing agents herein may be satisfactory in many instances, in some cases using water as the oxidation reagent presents various complexities. To achieve pressure and corrosion-resistance specifications, the size and weight of the chambers necessary can be very high and pose safety hazards. To safely inject water into the chamber, substantial cooling is used. For example, for a chamber that runs at greater than about 300° C., the system is first cooled below about 100° C. This can result in a drain on energy and/or time of manufacturing resources. Also, accurate dispensing of the water into the chamber can be complicated and expensive due to the water being a liquid.

Similarly, using air as the reagent can also present various complexities in some situations. The coated material formed may include the presence of —OH functionalities that can lead to adsorption in analytical and chromatographic applications. The material formed can have low impedance values at low frequency translating to inferior anti-corrosive performance. Also, the material formed can have low water contact angle values or high hydrophilicity.

While simpler, the use of air as the oxidation reagent can result in a loss of material properties of the coating. For example, in one embodiment, the coating 101 includes the presence of —OH functionalities that lead to adsorption in analytical and chromatographic applications. In one embodiment, the coating 101 has low impedance values at low frequency translating to inferior anti-corrosive performance. In one embodiment, the coating 101 has low contact angle values or high hydrophilicity.

Figure 12:
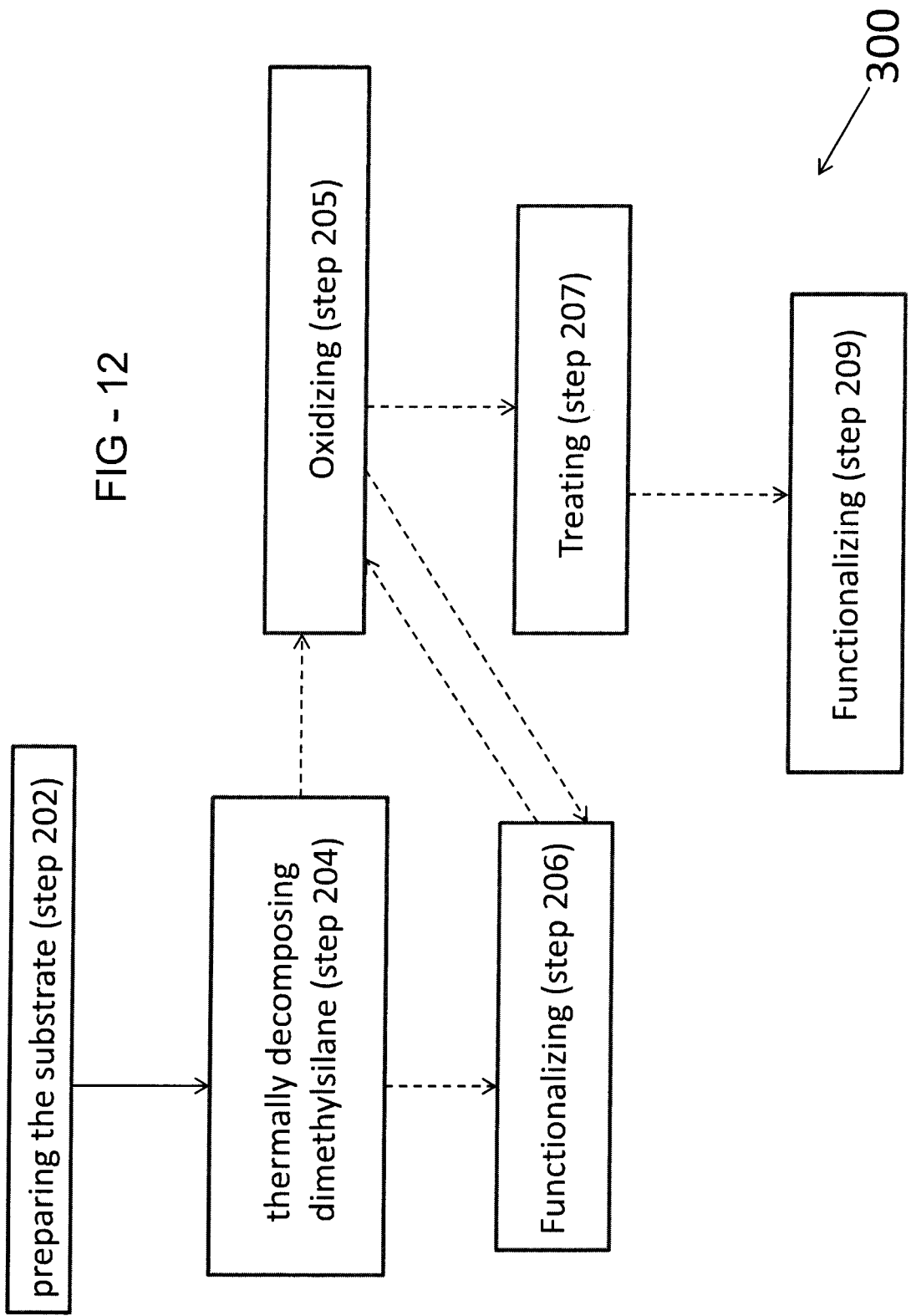
FIG. 12 shows a chemical vapor deposition method according to an exemplary embodiment of the disclosure.

Although these properties seem to render use of air as the oxidation reagent undesirable, the inventors have determined that in accordance with exemplary embodiments, including a method 300 shown in FIG. 12, that further treating the coating 101 or a portion of the coating following deposition allows the effect of the inferior properties to be ameliorated without sacrificing improved hardness and/or wear-resistance, while maintaining the advantages of using a gaseous oxidizing reagent, although oxidizing reagents can also be used in accordance with exemplary embodiments as previously described.

Referring to FIG. 12, in one embodiment, the method 300 includes treating (for example, heating and/or modifying the surface of) the layer 102 of the substrate 100 (step 207) to form a treated layer 806, further described below with reference to FIG. 13. The method 300 includes the method 200 shown in FIG. 4 and the treating (step 207). In one embodiment, the treating (step 207) follows the oxidizing (step 205), for example, of the initially-oxidized layer 802. In a further embodiment, functionalizing (step 209) follows the treating (step 207). Accordingly, in one embodiment, the oxidized layer, such as an air-oxidized layer 805, is treated (step 207) to form the treated layer 806 (for example, a trimethylsilyl treated amorphous carboxysilane layer) as illustrated in FIG. 13.

Figure 13:
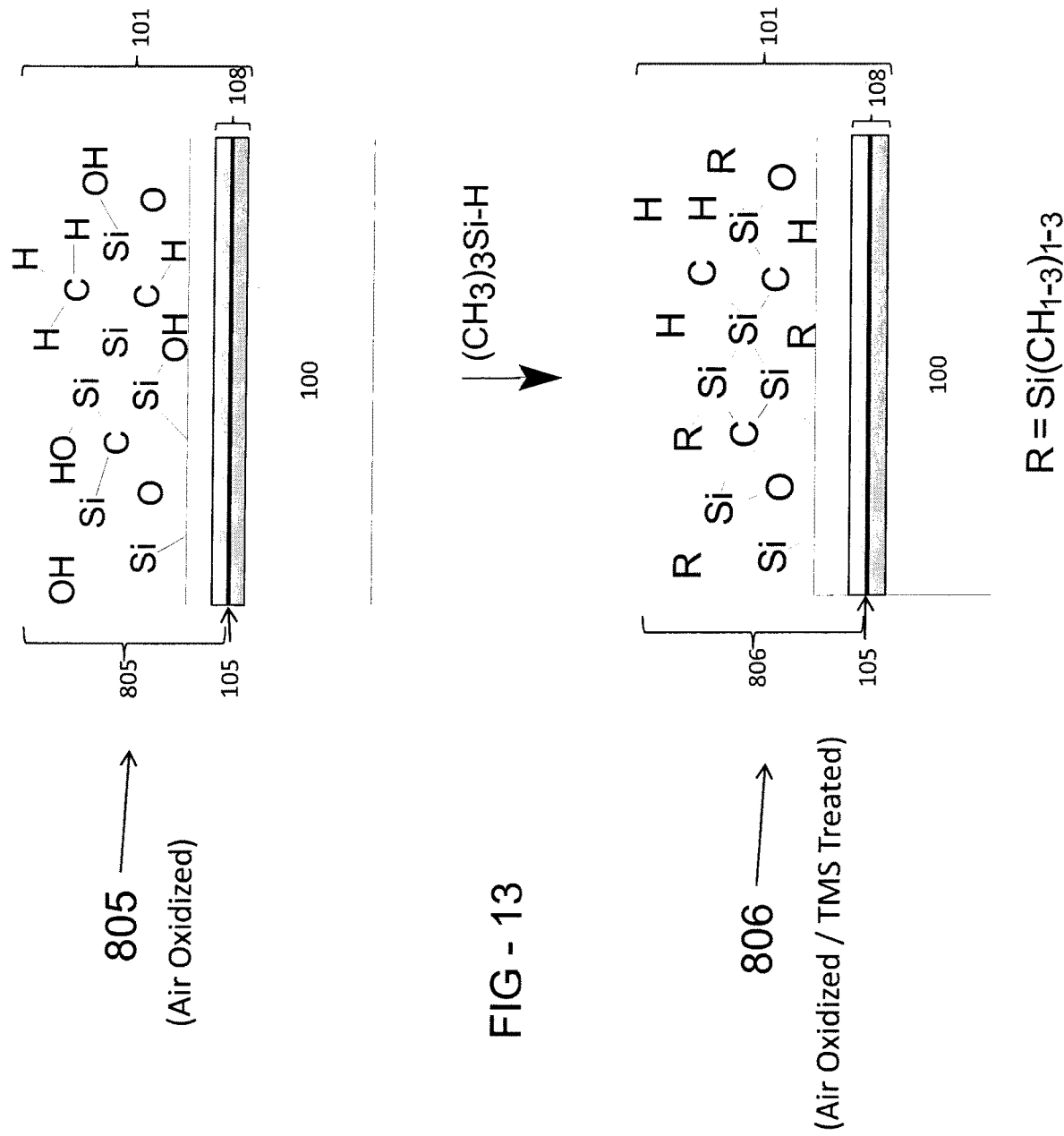
FIG. 13 shows a process of treating an air oxidized material according to an exemplary embodiment of the disclosure.
Figure 14:
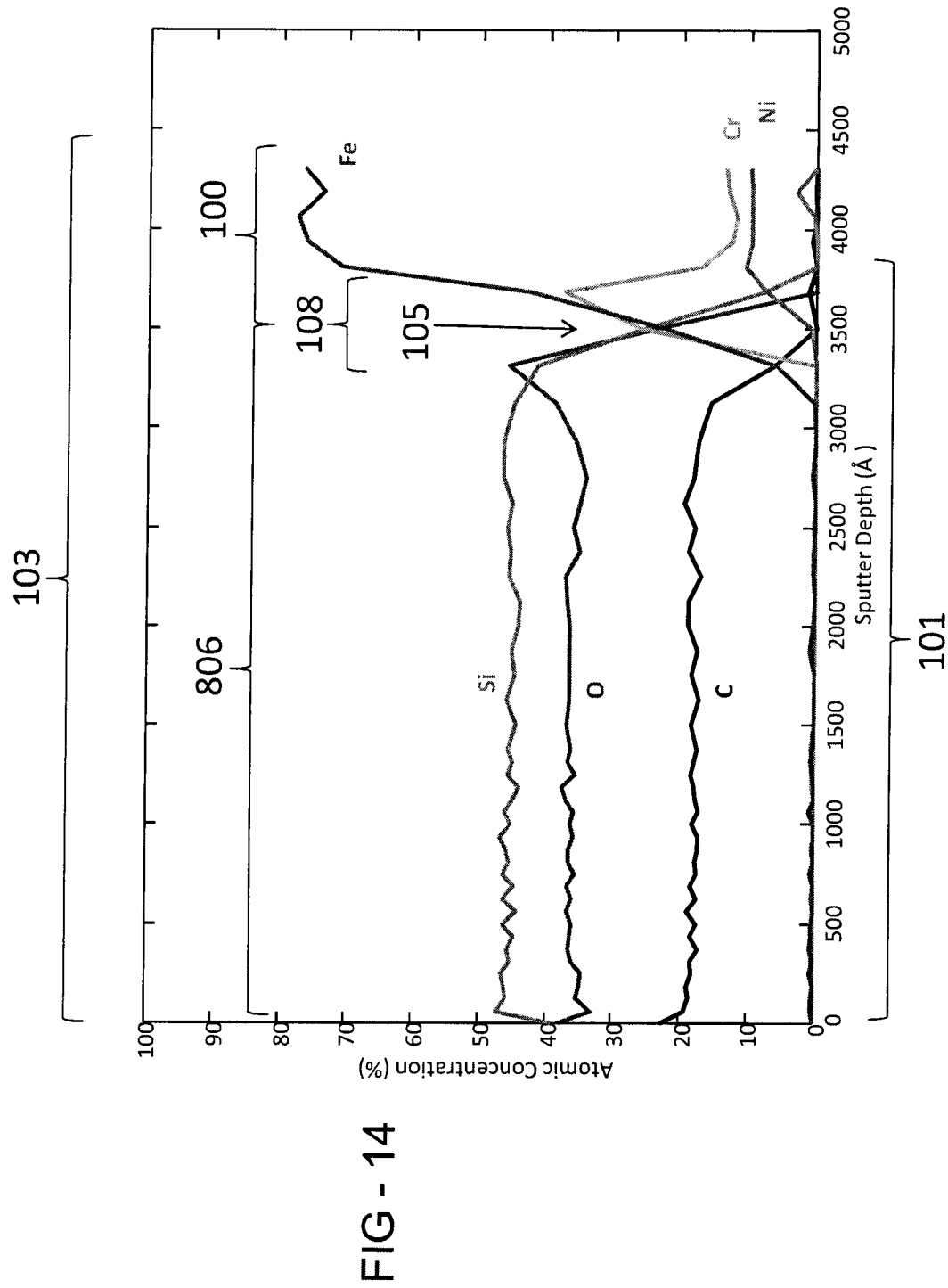
FIG. 14 shows an Auger Electron Spectroscopy plot for an exemplary embodiment of a coating on a substrate according to the disclosure.

Referring to FIGS. 13 and 14, the treated layer 806 can have greater wear resistance than the functionalized layer 110 formed with dimethylsilane and/or the air-oxidized layer 805. As such, in one embodiment of the method 300, the treating (step 207) increases wear resistance. For example, in one embodiment, the treated layer 806 has about a thirty-four-fold improvement in wear resistance over the functionalized layer 110 formed with dimethylsilane. Forming the treated layer 806 (for example, an air-oxidized carboxysilane layer) may be performed by reacting (for example, with —OH (hydroxyl) groups on silicon (silanols)) to undergo a condensation reaction (for example, with Si—H (silane) groups). In one embodiment, the treating (step 207) includes the following reaction:

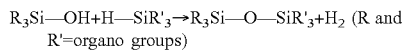

R₃Si—OH+H—SiR'₃→R₃Si—O—SiR'₃+H₂ (R and R'=organo groups)

By modifying and varying the R' groups, or by using other molecules capable of hydroxyl reactivity, surface properties of the treated layer 806 (for example, the air-oxidized carboxysilane layer) are adjusted. For example, in one embodiment, the adjustments increase or decrease hardness and wear resistance, inertness, electrochemical impedance, contact angle, and combinations thereof, thereby providing physical performance characteristics expanding the applicability and durability for use in the fields of process, analytical, gas, oil and semiconductor industries. The R-groups can be formed by hydrocarbons, substituted hydrocarbons, carbonyls, carboxyls, esters, ethers, amines, amides, sulfonic acids, organometalic complexes, and/or epoxides. Although not intending to be bound by theory, it is believed that the moieties of silicon hydride can thermally react, via a hydrosilyation mechanism, with unsaturated hydrocarbon groups to covalently bond to the surface of the coated substrate. In one embodiment, the coating 101 on all exposed surface within the reaction chamber includes covalently-bound R-groups which include the R-group and carbon, silicon, and hydrogen moieties.

FIG. 14 illustrates diffusion of the treated layer 806 into the substrate 100 (for example, stainless steel) according to an exemplary embodiment. Specifically, FIG. 14 shows the composition of the treated layer 806 within the substrate 100 and/or article 103 by Auger Electron Spectroscopy. In one embodiment, the treatment (step 207) results in a substantially stable concentration of Si, O, and C throughout the treated layer 806 until reaching the diffusion layer 108. In this embodiment, Si, O, and C atomic concentrations are at about 40%, 35%, and 20%, respectively. In one embodiment, the treated layer 806 extends to about 3500 Angstroms and includes the diffusion region 108 being about 400 Angstroms, identifiable based upon a decreased concentration of C and Si and a spike and then decrease in O. The range of the treated layer 806 can be between about 0.1 micrometers and about 3.0 micrometers. The diffusion region 108 can be between about 5 nanometers and 500 nanometers. The composition of the treated layer 806 is about 1.0:2.25:1.75 (C:Si:O).

In one embodiment, the treating (step 207) includes exposure of the article 100, the coating 101, the layer 102, the functionalized layer 110, the air-oxidized layer 805, or combinations thereof to an organosilane reagent. In one embodiment, the organosilane reagent is a trifunctional organosilane that consists of the general formula RR'R"Si—H, where R,R',R" are organofunctional groups. Examples of the organofunctional groups are alkyl, aryl, halogenated alkyl and aryl, ketones, aldehydes, acyl, alcohol, epoxy, and nitro-organo groups, and organometallic functionalities. In one embodiment, the organosilane is trimethylsilane.

Heat, exposure times, diluent gases, and pressures are adjusted to affect the degree of treating (step 207). Control of this degree of treating (step 207) imparts the desired properties. In one embodiment, the oxidized layer is exposed to the organosilane reagent at a temperature of about 300 to 600° C., for about 1 to 24 hours and at a pressure of about 5 to 100 psia, in some cases about 25 psia, about 27 psia, about 54 psia, or any suitable ranges therebetween. Inert diluent gases may be used, such as argon or nitrogen, at partial pressures of about 1 to 100 psia to assist the reaction.

Figure 15:
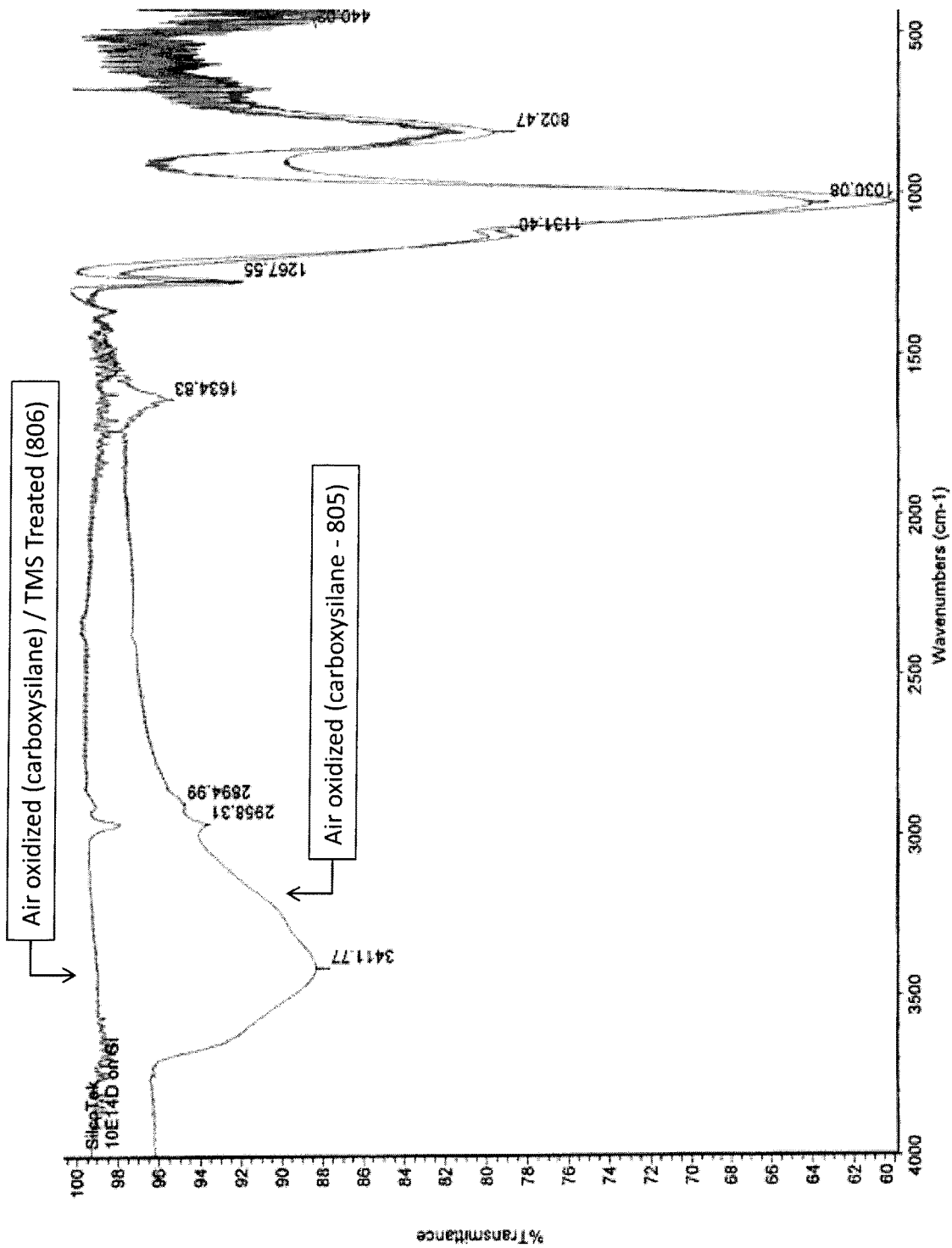
FIGS. 15-19 show various analytical results for the treated material illustrated in FIG. 12.
Figure 16:
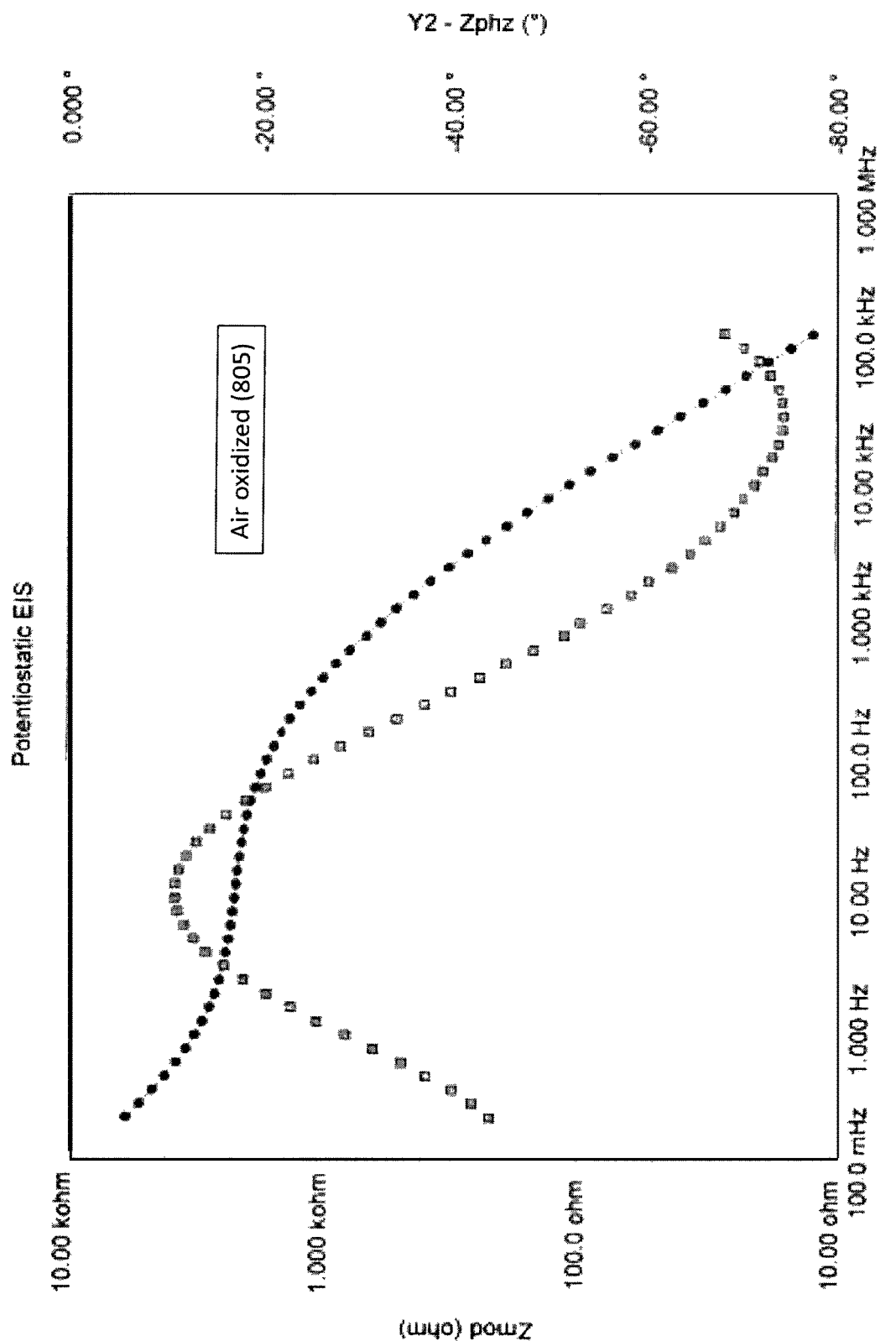
Figure 17:
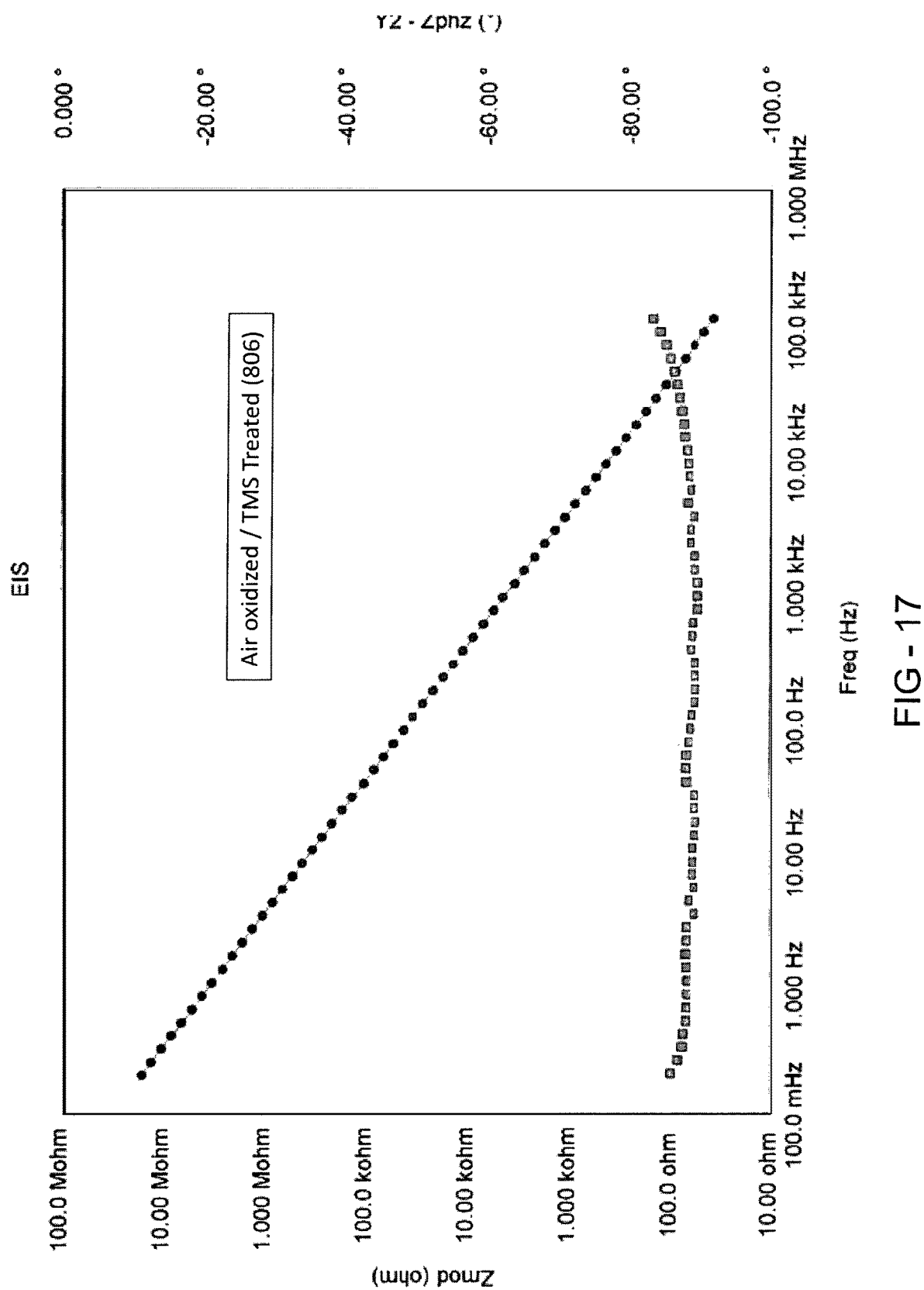
Figure 18:
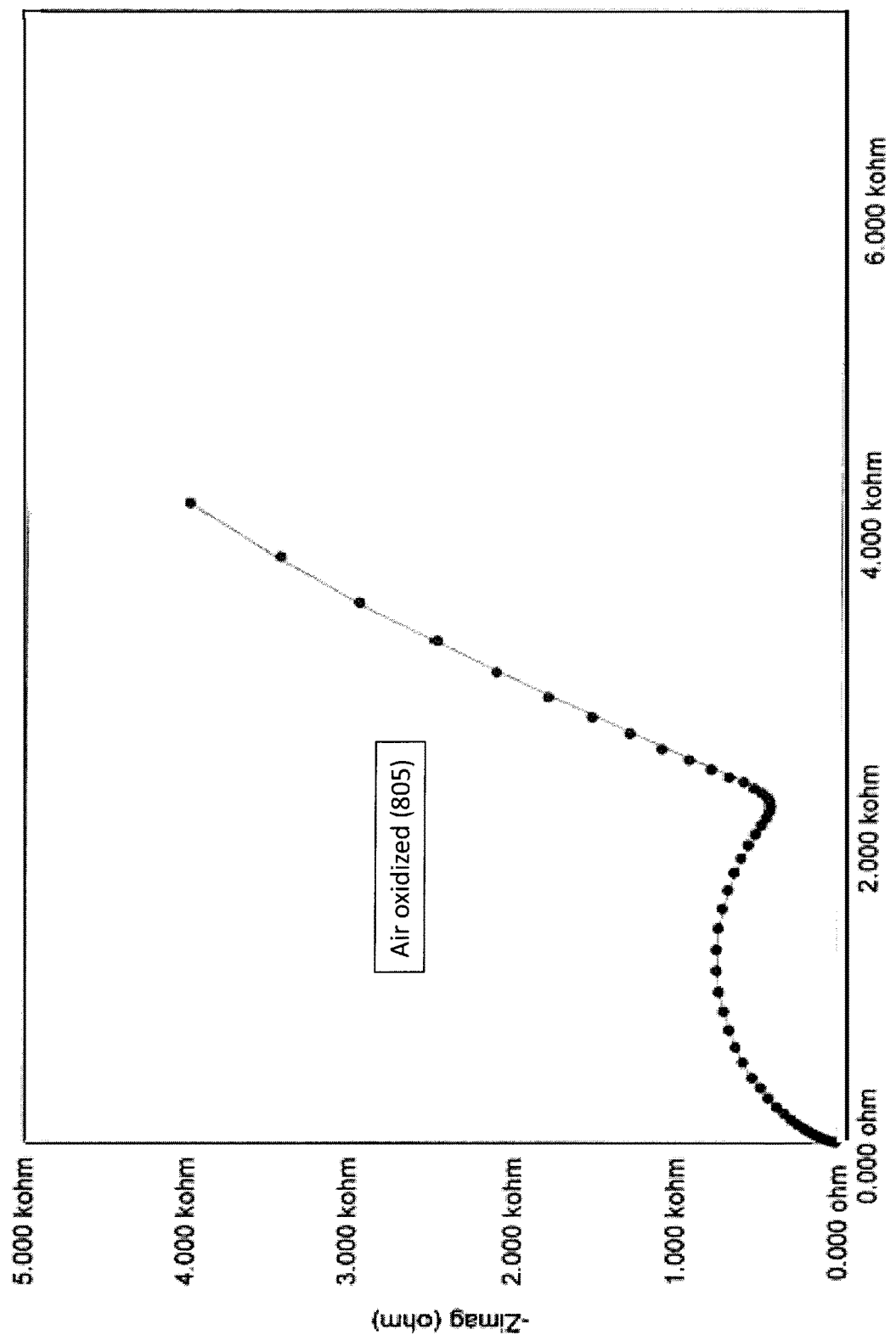
Figure 19:
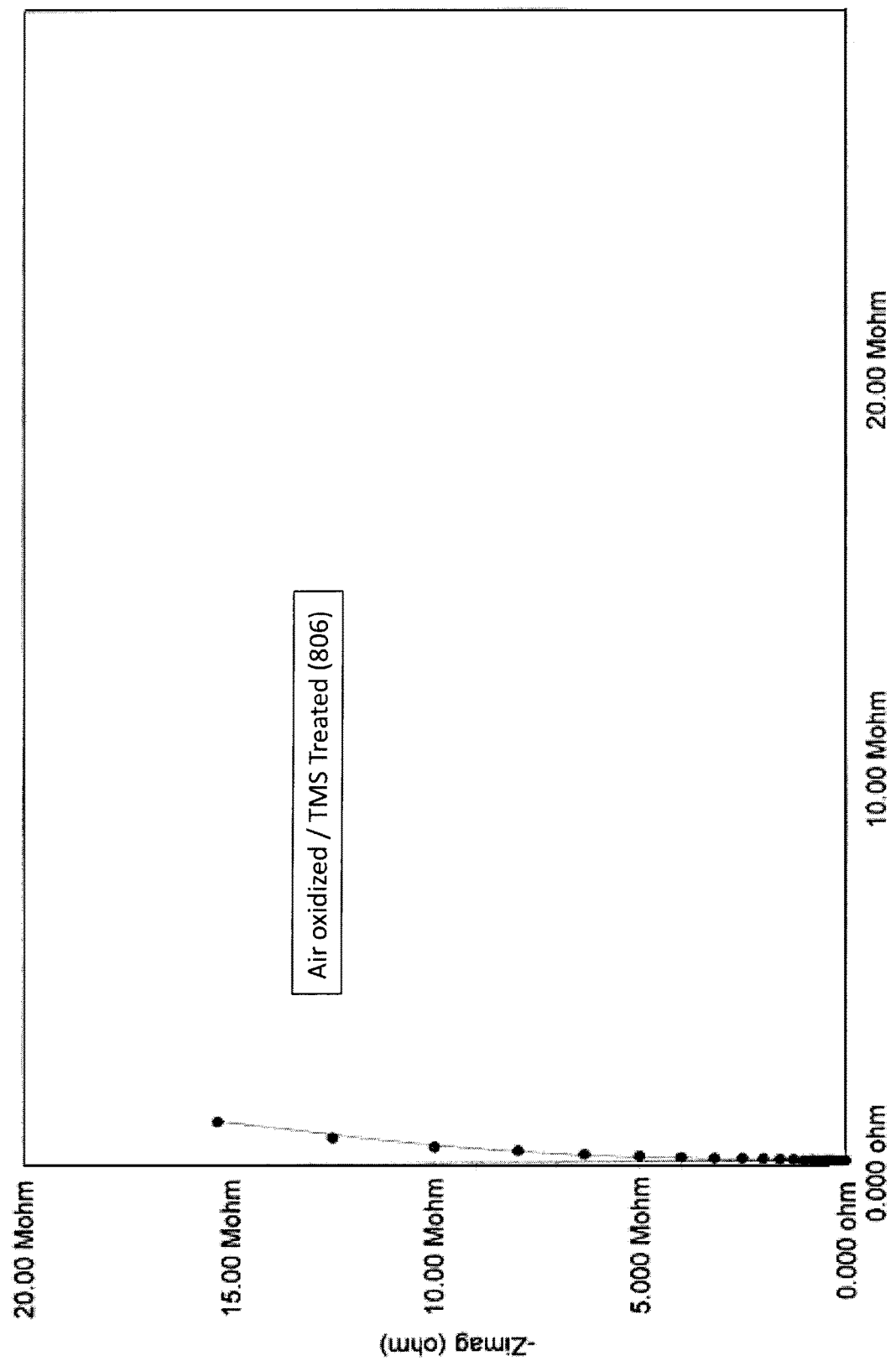

In one embodiment, the air-oxidized layer 805 (for example, a dimethylsilane-based carboxysilane layer formed by air-oxidizing the layer 102) is treated by exposure to trimethylsilane (for example, at 450° C. for 10 hours at 25 psia). In this embodiment, the treated layer 806 includes a loss of Si—OH functionality (in comparison to the air-oxidized layer 805, see FIG. 15 at 3411.8 cm$^{-1}$), an increase in contact angle measurement (for example about 99.1° for deionized water in comparison to about 50.9° prior to the reaction), a presence of hydrophobicity, excellent impedance (for example, at low frequency ($Z_{lf}$) of about 15.4 Mohm (increased from a $Z_{lf}$=about 7.27 kohm from the air-oxidized layer 805, FIGS. 16 and 17), and/or a terminal $Z_R/Z_I$ ratio of about 0.072 from a Nyquist plot, FIGS. 18 and 19), and combinations thereof.

Figure 20:
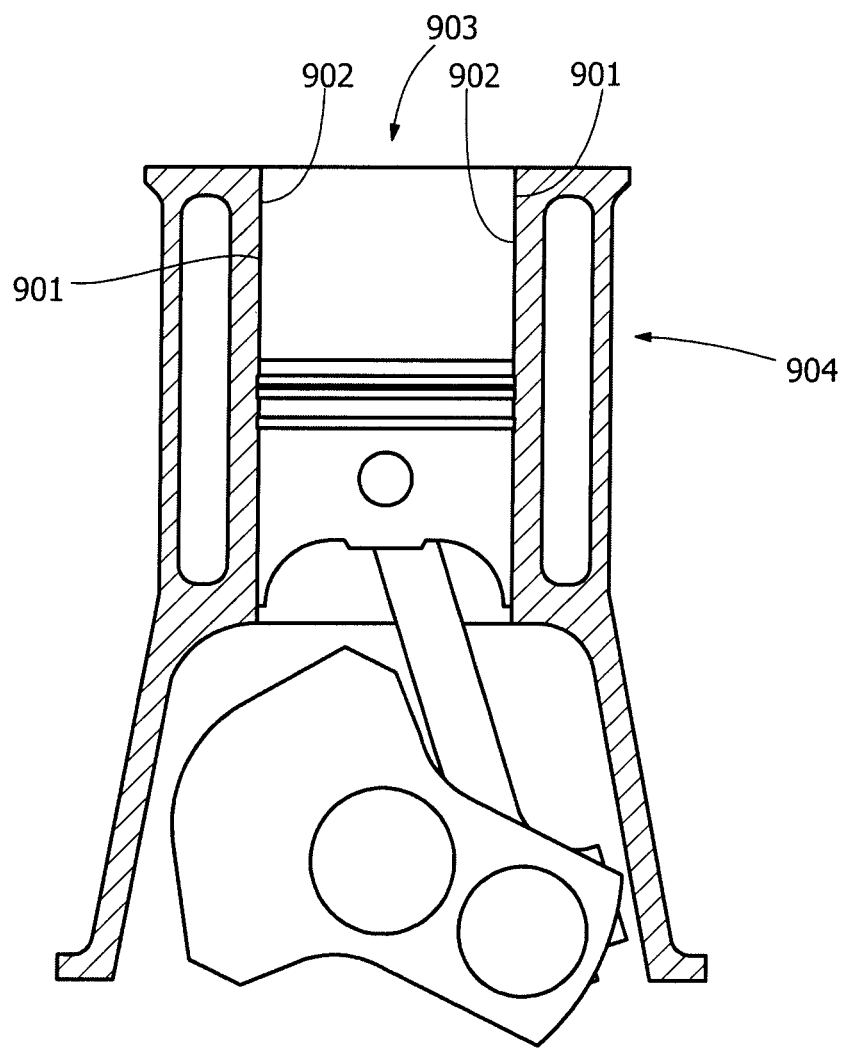
FIG. 20 shows a piston having a wear surface on which a coating is applied, illustrating applications in which the wear surface is moved over another surface.
Figure 21:
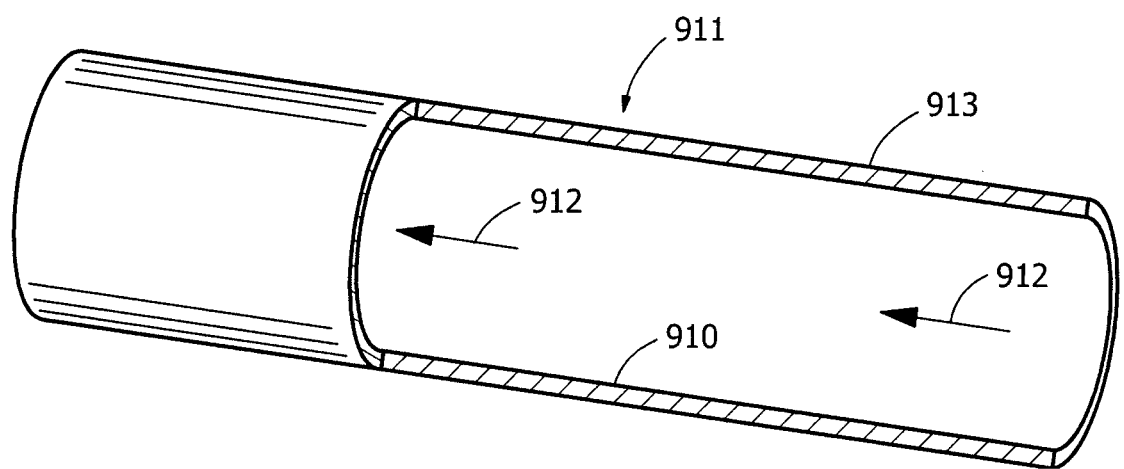
FIG. 21 shows a pipe having a wear surface on which a coating is applied, illustrating application is which the wear surface is exposed to fluid motion.

In the embodiments, it is desirable to provide adequate wear resistance to prevent surface wear of the components, which includes wear (surfaces in sliding or rolling motion) and friction (resistance to relative motion of contacting bodies), of the components on which the coating 101 and/or the layer 102 is deposited. Wear occurs where two surfaces or materials undergo movement, such as sliding or rolling under load. Wear is essentially a process of the removal of material from a solid surface and can be caused by abrasion, erosion, adhesion, surface fatigue and/or corrosion. Examples of applications in which wear occurs are illustrated in FIGS. 20 and 21. FIG. 20 illustrates an application in which two surfaces 901 and 902 are in contact and are moved relative to each other in a reciprocating motion. In the exemplary embodiment shown, the surfaces are on a piston head 903 and a cylinder 904, but the surfaces could be on any moving parts. FIG. 21 illustrates an application is which a surface 910 contacted by a moving fluid. In the exemplary embodiment shown, the surface is the interior of a pipe 911 through which a fluid such as gas and/or liquid flow(s), as indicated by arrows 912, but the surface could be on any part which is in contact with fluid motion.

With proper wear resistance, surface wear is reduced thereby effectively extending the operational life of the component. As operational environments are normally complex, it is important that the coating 101 and/or the layer 102 be formulated to prevent both the chemical and physical degradation to the surface of the component. An example of an application of a component working in an aggressive environment is a drilling tool used in the oil and gas industry. The tool experiences high loads, high speeds and friction and, as a consequence high temperatures. These factors can lead to surface wear of the components. Other such applications in aggressive or harsh environments in which the coating 101 and/or the layer 102 may be of benefit, include, but are not limited to, systems or components with particulate flow and/or sliding wear. Such applications include, but are not limited to, tubing, fittings, valves (rotary, ball, slide, etc.), injectors, piston rings, sliding o-rings, cylinders, regulators, mixing systems, sampling apparatus, analytical systems for use in the oil and gas industry, process and analytical equipment, internal combustions engines, semiconductors, and the like.

While the coating thickness depends on the geometry of the part to be coated and the type of finish required, in an exemplary embodiment made according to the methods disclosed, the coating 101 or the layer 102 has a thickness of about 100 nm to about 10,000 nm or, more specifically, about 200 nm to about 5,000 nm, or, even more specifically, about 300 nm to about 1500 nm. The wear resistance ranges between about $13\times10^{-5}$ mm³/Nm and about $0.5\times10^{-5}$ mm³/Nm, or more specifically, between about $9\times10^{-5}$ mm³/Nm and about $1\times10^{-5}$ mm³/Nm, or, even more specifically, between about $6.2\times10^{-5}$ mm³/Nm and about $1.3\times10^{-5}$ mm³/Nm. The coefficient of friction ranges between about 0.58 and about 0.05 or, more specifically, between about 0.5 and about 0.075, or, even more specifically, between about 0.38 and about 0.1.

The coatings 101 and/or the layers 102 applied in accordance herewith improve resistance to the wear caused by stress interactions and deformation properties of the mating surfaces, such as abrasion, adhesion and fatigue. Abrasive wear (also referred to as scratching, gouging or scoring) occurs when material is removed from one surface by another harder material, leaving hard particles of debris between the two surfaces. Adhesive wear (often called galling or scuffing) occurs where interfacial adhesive junctions lock together as two surfaces slide across each other under pressure. As normal pressure is applied, local pressure at the asperities become extremely high, often exceeding the yield stress causing the asperities to deform plastically. Fatigue occurs when the periodic motion of mechanical machinery cause stresses to the surfaces of the component. These effects are mainly based on the action of stresses in or below the surfaces, without the need of direct physical contact of the surfaces under consideration. When two surfaces slide across each other, the maximum shear stress lies some distance below the surface, causing microcracks which propagate to the surface, which lead to failure of the component.

In addition the coating 101 and/or layer 102 improve the resistance of the surface of the component to erosion (from both solid and liquid) and corrosion. Erosion (from both solid and liquid) occurs when an impinging particle or stream contacts the surface of the component. In corrosive wear the connecting surfaces react with the environment and reaction products are formed on the surface asperities. Attrition of the reaction products then occurs as a result of crack formation, and/or abrasion, in the contact interactions of the materials.

The coating 101 and/or the layer 102 made and applied in accordance herewith provides increased adhesion of the coating 101 and/or the layer 102 to the substrate 100, thereby improving the wear characteristics of the coating 102 and/or the layer 102. The coating 101 and/or the layer 102 is hard and adheres tenaciously to a bearing surface of the substrate 100. This allows the coating 101 and/or the layer 102 to be used in aggressive or harsh environments in which the substrate 100 is exposed is subject to wear and/or erosion. In the exemplary embodiment shown in FIG. 20, either surface 901, 902 may have the coating 101 applied thereto. Alternatively, both surfaces 901, 902 may have the coating applied. In the exemplary embodiment shown in FIG. 21, the surface 910 may have the coating 101 applied. In addition, an outer surface 913 may have the coating 101 applied to protect the item 911 from damage during transportation and the like.

EXAMPLE 1

The first example included introducing dimethylsilane to the substrate 100 for 2 hours at 8 psia gas at 450° C. to form the layer 102. In the first example, the layer 102 was almost undetectable (i.e., very difficult to visually discern) on a mirror-polished 316 stainless steel coupon (slightly yellowed). Measurements showed water contact angle data prior to the deposition treatment at around 60°. After the deposition treatment with dimethylsilane, the contact angle increased to around 102°. Although the layer 102 was not visible, the data indicated an extremely thin deposition with a significant density of carbosilyl material on the layer 102 of the surface 105. The thickness of the layer 102 was estimated to be at about 100 Angstroms as available spectroscopic techniques were not sensitive enough to detect the coating.

EXAMPLE 2

The second example included introducing dimethylsilane to the substrate 100 for 15 hours at 8 psia gas at 450° C. to form the layer 102. In the second example, the layer 102 had a visible luminescent rainbow array of colors. Measurements showed average deionized water contact angle data around 100°, for mirror-finished 316 stainless steel surfaces and polished silicon wafer surfaces. FT-IR indicated the presence of C—H based upon a reading at 2950 cm$^{-1}$, the presence of Si—C based upon a reading at 792 cm$^{-1}$, and the presence of Si—H moieties based upon a reading at 2102 cm$^{-1}$. The thickness of the layer 102 was determined by spectrometer to be about 800 Angstroms. Further measurements utilizing Auger Electron Spectroscopy were also performed. The measurements showed increased concentrations of Si and C atoms on the layer 102. The measurement further showed the concentration of Si and C atoms decreasing upon reaching the diffusion region 108 illustrated by the increase in concentration of Fe, Cr, and Ni atoms. The measurement showed the concentration of Si and C atoms being asymptotic with zero upon reaching a point beyond the diffusion region 108. The measurement also showed that the diffusion region 108 can be identified based upon the concentration of O atoms being elevated (the result of a surface oxide on the surface 105 of the substrate 100 prior to deposition).

EXAMPLE 3

The third example included introducing dimethylsilane to the substrate 100 for 15 hours at 8 psia gas at 450° C. to form the layer 102 and subsequently oxidizing the layer 102 of the substrate 100 with water in an inert gas for 2 hours at about 100 to 200 psia gas at 450° C. to form the oxidized layer 802. The third example showed undesirable results. For example, FT-IR data failed to reveal the presence of any functional moieties (Si—OH or Si—H) for surface modification chemistry. The oxidized layer 802 had a contact angle on a Si wafer of 86.6°, and a presence of Si—O—Si groups.

EXAMPLE 4

The fourth example included introducing dimethylsilane to the substrate 100 for 15 hours at 8 psia gas at 450° C. to form the layer 102 and subsequently oxidizing the layer 102 of the substrate 100 with an oxidation reagent mixture for 2 hours at about 100 to 200 psia gas at 300° C. to form the oxidized layer 805. The oxidation reagent mixture included air and water. The fourth example showed undesirable results. According to FT-IR data, the oxidized layer 805 was over-oxidized, had a decrease of C—H groups (in comparison to Example 3), a decrease of Si—C groups (in comparison to Example 3), and an increase of Si—OH/C—OH groups (in comparison to Example 3).

EXAMPLE 5

The fifth example included introducing dimethylsilane to the substrate 100 for 15 hours at 8 psia gas at 450° C. to form the layer 102 and subsequently oxidizing the layer 102 on the substrate 100 with air for 2 hours at about 100 to 200 psia gas at 300° C. to form the oxidized layer 805. The fifth example produced an oxidized carbosilane material with a significant Si—OH stretch observed in the FT-IR data (broad; 3414 cm$^{-1}$). Contact angle was measured to be 50.9° for deionized water. Electrochemical impedance spectroscopy showed impedance at low frequency $Z_{lf}$=about 7.27 kohm. Wear resistance of the material was analyzed with a Tribometer (CSM Instruments S/N 18-343) applying a 0.5 N force via a standard 100 Cr6 ball and circular linear speed of 3.00 cm/s thereby showing a 4.141×10$^{-3}$ wear (mm$^3$/N m). The oxidized layer 805 had lower friction (in comparison to Example 3), higher wear (in comparison to Example 3), and a presence of Si—O—Si groups.

EXAMPLE 6

The sixth example included functionalizing the layer 102 formed in Example 2 with ethylene to form the functionalized layer 110. The functionalized layer 110 had a water contact angle of 98.3° advancing and 85.1° receding. As shown in FIG. 10, FT-IR data showed little oxidation occurred based upon a lack of Si—O—Si groups (based upon a stretch at 1027 cm$^{-1}$) and decreased an amount of Si—H groups (based upon a stretch at 2091 cm$^{-1}$).

EXAMPLE 7

The seventh example including functionalizing the layer 102 formed in Example 2 with ethylene to form the functionalized layer 110. Then, the functionalized layer 110 was oxidized by 5 ml deionized water (DI) being added to the chamber. The chamber was exposed to several nitrogen flushes and mild vacuum to remove air from the sealed container. The temperature in the chamber was held at 450° C. for about 2 hours, then returned to room temperature. The oxidation of the functionalized layer 110 formed the functionalized then oxidized layer 804. The functionalized then oxidized layer 804 had a water contact angle data of 95.6° advancing and 65.9° receding. As shown in FIG. 10, FT-IR showed that oxidation increased an amount of Si—O—Si groups (based upon a stretch at 1027 cm$^{-1}$) and decreased an amount of Si—H groups (based upon a stretch at 2091 cm$^{-1}$) in comparison to the functionalized layer 110 formed in Example 6.

EXAMPLE 8

The eighth example included introducing trimethylsilane to the layer 102 (dimethylsilane) for 15 hours at 8 psia gas at 450° C. The eighth example showed undesirable results, including no visible or spectroscopically measurable coating on the substrate 100, nor was there any indication of a molecular coating as there was no significant change in water contact angle values.

EXAMPLE 9

The ninth example included treating the oxidized layer 805 formed in Example 5 with trimethylsilane to form the treated layer 806. Specifically, trimethylsilane was added to an evacuated chamber including the material at 450° C. and 25 psia and reacted for about 10 hours. Resultant FT-IR data showed a loss of Si—OH functionality (see FIG. 15). Contact angle was measured to be 99.1° for deionized water, suggesting a presence of hydrophobicity. Electrochemical impedance spectroscopy showed impedance at low frequency ($Z_{lf}$) of 15.4 Mohm. Electrochemical impedance spectroscopy also showed a Bode plot and terminal $Z_R/Z_I$ ratio of 0.072 from a Nyquist plot (see FIGS. 16-19). Wear resistance of the material was analyzed with a Tribometer (CSM Instruments S/N 18-343) applying a 0.5 N force via a standard 100 Cr6 ball and circular linear speed of 3.00 cm/s thereby showing a 1.225×10$^{-4}$ wear (mm$^3$/Nm), a thirty-four-fold increase in comparison to the non-treated material.

While only certain features and embodiments of the invention have been shown and described, many modifications and changes may occur to those skilled in the art (for example, variations in sizes, dimensions, structures, shapes and proportions of the various elements, values of parameters (for example, temperatures, pressures, etc.), mounting arrangements, use of materials, colors, orientations, etc.) without materially departing from the novel teachings and advantages of the subject matter recited in the claims. The order or sequence of any process or method steps may be varied or re-sequenced according to alternative embodiments. It is, therefore, to be understood that the appended claims are intended to cover all such modifications and changes as fall within the true spirit of the invention. Furthermore, in an effort to provide a concise description of the exemplary embodiments, all features of an actual implementation may not have been described (i.e., those unrelated to the presently contemplated best mode of carrying out the invention, or those unrelated to enabling the claimed invention). It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

What is claimed is:

1. An article having a wear coating comprising:
   a layer treated by trimethylsilane applied to a surface of the article
   wherein the wear coating is applied by chemical vapor deposition via thermal decomposition of dimethylsilane;
   wherein constituents of the decomposed dimethylsilane are oxidized prior to trimethylsilane treatment.

2. The article of claim 1, wherein the article is in reciprocating contact with a second article.

3. The article of claim 2, wherein the article is a piston head or a piston cylinder.

4. The article of claim 1, wherein the article is a drilling tool.

5. The article of claim 1, wherein the surface is an interior surface of the article.

6. The article of claim 1, wherein constituents of the decomposed dimethylsilane are functionalized.

7. The article of claim 1, wherein the wear coating has a thickness of about 100 nm to about 10,000 nm.

8. The article of claim 1, wherein the wear coating has a wear resistance between about 13×10$^{-5}$ mm$^3$/Nm and about 0.5×10$^{-5}$ mm$^3$/Nm upon application of a 0.5 N force via a standard 100 Cr6 ball and circular linear speed of 3.00 cm/s.

9. The article of claim 1, wherein the wear coating has a coefficient of friction between about 0.58 and about 0.05.

10. The article of claim 1, wherein the surface of the article to which the wear coating is applied is metal or metallic.

11. The article of claim 1, wherein the wear coating has a thickness in the range of about 100 nm to about 10,000 nm, a wear resistance in the range of about $13 \times 10^{-5}$ mm$^3$/Nm to about $0.5 \times 10^{-5}$ mm$^3$/Nm upon application of a 0.5 N force via a standard 100 Cr6 ball and circular linear speed of 3.00 cm/s, and a coefficient of friction between about 0.58 and about 0.05.

12. The article of claim 1, wherein the wear coating has a thickness of about 200 nm to about 5,000 nm.

13. The article of claim 1, wherein the wear coating has a thickness of about 300 nm to about 1,500 nm.

14. The article of claim 1, wherein the constituents of the decomposed dimethylsilane that are oxidized form an oxidized layer.

15. The article of claim 14, wherein the oxidized layer extends for 1,600 Angstroms.

16. The article of claim 1, wherein the thermal decomposition of the dimethylsilane is at a temperature between 400° C. and 500° C.

17. The article of claim 1, wherein the surface of the article to which the wear coating is applied is ceramic.

18. The article of claim 1, wherein the surface of the article to which the wear coating is applied is glass.

19. An article, comprising a dimethylsilane-based layer on the article, an oxidization of the dimethylsilane-based layer on the dimethylsilane-based layer, and a trimethylsilane-based treatment on the oxidation.

\* \* \* \* \*